US012675045B2

(12) United States Patent
Aqad et al.

(10) Patent No.: US 12,675,045 B2
(45) Date of Patent: Jul. 7, 2026

(54) POLYMER, PHOTORESIST COMPOSITIONS INCLUDING THE SAME, AND PATTERN FORMATION METHODS

(71) Applicant: ROHM AND HAAS ELECTRONIC MATERIALS LLC, Marlborough, MA (US)

(72) Inventors: Emad Aqad, Northborough, MA (US); Li Cui, Westborough, MA (US); Yinjie Cen, Shrewsbury, MA (US); Wenxu Zhang, Natick, MA (US); Mingqi Li, Shrewsbury, MA (US); James F. Cameron, Brookline, MA (US)

(73) Assignee: DUPONT ELECTRONIC MATERIALS INTERNATIONAL, LLC, Marlborough, MA (US)

( * ) Notice: Subject to any disclaimer, the term of this patent is extended or adjusted under 35 U.S.C. 154(b) by 679 days.

(21) Appl. No.: 18/090,145

(22) Filed: Dec. 28, 2022

(65) Prior Publication Data

US 2024/0241440 A1 Jul. 18, 2024

(51) Int. Cl.

| | |
|---|---|
| ***G03F 7/039*** | (2006.01) |
| ***C08F 212/14*** | (2006.01) |
| ***C08F 220/18*** | (2006.01) |
| ***G03F 7/038*** | (2006.01) |

(52) U.S. Cl.

CPC ............ *G03F 7/039* (2013.01); *C08F 212/24* (2020.02); *C08F 220/1808* (2020.02); *C08F 220/1809* (2020.02); *G03F 7/038* (2013.01)

(58) Field of Classification Search

CPC ........................................................ G03F 7/00

See application file for complete search history.

(56) References Cited

U.S. PATENT DOCUMENTS

| | | | | |
|---|---|---|---|---|
| 4,189,323 | A | 2/1980 | Buhr | |
| 8,431,325 | B2 | 4/2013 | Hashimoto et al. | |
| 2003/0208018 | A1 * | 11/2003 | Hong | C07C 303/28 526/287 |
| 2006/0110677 | A1 * | 5/2006 | Houlihan | G03F 7/0397 430/270.1 |

FOREIGN PATENT DOCUMENTS

| | | | | |
|---|---|---|---|---|
| EP | 0727713 | A1 | | 8/1996 |
| JP | H0627750 | A | * | 2/1994 |
| JP | 2005154524 | A | | 6/2005 |
| JP | 2006330401 | A | | 12/2006 |
| JP | 4781011 | B2 | | 9/2011 |
| JP | 2015018107 | A | | 1/2015 |
| JP | 2020008640 | A | | 1/2020 |

OTHER PUBLICATIONS

Japanese Office Action for the corresponding Japanese Application No. 2023-216504, Date of Mailing: Feb. 14, 2025; 2 pages.

* cited by examiner

*Primary Examiner* — Chanceity N Robinson
(74) *Attorney, Agent, or Firm* — CANTOR COLBURN LLP

(57) ABSTRACT

A polymer, including a first repeating unit comprising a sulfone group, wherein the sulfone group is directly bonded to a group of formula —C($R^a$)($R^b$)—; and a second repeating unit comprising an acid labile group, a base-decomposable group, a polar group, or a combination thereof, wherein $R^a$ and $R^b$ are each independently hydrogen, halogen, substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl, provided that at least one of $R^a$ and $R^b$ is hydrogen.

16 Claims, No Drawings

POLYMER, PHOTORESIST COMPOSITIONS INCLUDING THE SAME, AND PATTERN FORMATION METHODS

FIELD

The present invention relates to polymers for photoresist compositions and to pattern formation methods using such photoresist compositions. The invention finds applicability in lithographic applications in the semiconductor manufacturing industry.

BACKGROUND

Photoresist materials are photosensitive compositions typically used for transferring an image to one or more underlying layers such as a metal, semiconductor or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

Chemically amplified photoresists are conventionally used for high-resolution processing. Such resists typically employ a polymer having acid-labile groups, a photoacid generator and an acid quenching material. Pattern-wise exposure to activating radiation through a photomask causes the acid generator to form an acid which, during post-exposure baking, causes cleavage of the acid-labile groups in exposed regions of the polymer. Acid quenching materials are often added to the photoresist composition for controlling the diffusion of the acid to unexposed region to improve the contrast. The result of the lithographic process is the creation of difference in solubility characteristics between exposed and unexposed regions of the resist in a developer solution. In a positive tone development (PTD) process, exposed regions of the photoresist layer become soluble in the developer and are removed from the substrate surface, whereas unexposed regions, which are insoluble in the developer, remain after development to form a positive image. The resulting relief image permits selective processing of the substrate.

Despite the advancement in resist technology, there is still a need for photoresists compositions that address one or more problems associated with the state of the art. In particular, there is a continuing need for photoresist compositions having good sensitivity, including photoresist compositions that can achieve higher contrast, a lower line width roughness (LWR) for line/space patterns.

SUMMARY

An aspect provides a polymer including a first repeating unit comprising a sulfone group, wherein the sulfone group is directly bonded to a group of formula —C($R^a$)($R^b$)—; and a second repeating unit including an acid labile group, a base-decomposable group, a polar group, or a combination thereof, wherein $R^a$ and $R^b$ are each independently hydrogen, halogen, substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl, provided that at least one of $R^a$ and $R^b$ is hydrogen.

Also provided is a photoresist composition including a first polymer, including: a first repeating unit comprising a sulfone group, wherein the sulfone group is directly bonded to a group of formula —C($R^a$)($R^b$)—; wherein $R^a$ and $R^b$ are each independently hydrogen, halogen, substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl; provided that at least one of $R^a$ and $R^b$ is hydrogen; and a solvent.

Still another aspect provides a method of forming a pattern including applying a layer of a photoresist composition on a substrate to form a photoresist composition layer; pattern-wise exposing the photoresist composition layer with activating radiation to form an exposed photoresist composition layer; and developing the exposed photoresist composition layer.

The above described and other features are exemplified by the following detailed description.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "actinic rays" or "radiation" means, for example, a bright line spectrum of a mercury lamp, far ultraviolet rays represented by an excimer laser, extreme ultraviolet rays (EUV light), X-rays, particle rays such as electron beams and ion beams, or the like. In addition, in the present invention, "light" means actinic rays or radiation. The krypton fluoride laser (KrF laser) is a particular type of excimer laser, which is sometimes referred to as an exciplex laser. "Excimer" is short for "excited dimer," while "exciplex" is short for "excited complex." An excimer laser uses a mixture of a noble gas (argon, krypton, or xenon) and a halogen gas (fluorine or chlorine), which under suitable conditions of electrical stimulation and high pressure, emits coherent stimulated radiation (laser light) in the ultraviolet range. Furthermore, "exposure" in the present specification includes, unless otherwise specified, not only exposure by a mercury lamp, far ultraviolet rays represented by an excimer laser, X-rays, extreme ultraviolet rays (EUV light), or the like, but also writing by particle rays such as electron beams and ion beams.

A used herein, an "organic group" includes one or more carbon atoms, for example 1 to 60 carbon atoms. The term "hydrocarbon" refers to an organic compound or to an organic group having at least one carbon atom and at least one hydrogen atom. The term "alkyl" refers to a straight or branched chain saturated hydrocarbon group having the specified number of carbon atoms and having a valence of one; "alkylene" refers to an alkyl group having a valence of two; "hydroxyalkyl" refers to an alkyl group substituted with at least one hydroxyl group (—OH); "alkoxy" refers to "alkyl-O—"; "carboxyl" and "carboxylic acid group" refer to a group having the formula "—C(=O)—OH"; "cycloalkyl" refers to a monovalent group having one or more saturated rings in which all ring members are carbon; "cycloalkylene" refers to a cycloalkyl group having a valence of two; "alkenyl" refers to a straight or branched chain, monovalent hydrocarbon group having at least one carbon-carbon double bond; "alkenoxy" refers to "alkenyl-O—"; "alkenylene" refers to an alkenyl group having a valence of two; "cycloalkenyl" refers to a non-aromatic cyclic divalent hydrocarbon group having at least three carbon atoms, with at least one carbon-carbon double bond; "alkynyl" refers to a monovalent hydrocarbon group having at least one carbon-carbon triple bond; the term "aromatic group" refers to a monocyclic or polycyclic ring system that satisfies the Huckel Rule and includes carbon atoms in the ring, and optionally may include one or more heteroatoms selected from N, O, and S instead of a carbon atom in the ring; "aryl" refers to a monovalent aromatic monocyclic or polycyclic ring system where every ring member is carbon, and may include a group with an aromatic ring fused to at least one cycloalkyl or heterocycloalkyl ring; "arylene" refers to an aryl group having a valence of two; "alkylaryl" refers to an aryl group that has been substituted with an alkyl group; "arylalkyl" refers to an alkyl group that has been substituted with an aryl group; "aryloxy" refers to "aryl-O—"; and "arylthio" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, or P; "heteroatom-containing group" refers to a substituent group that includes at least one heteroatom; "heteroalkyl group" refers to an alkyl group having 1-4 or more heteroatoms instead of carbon; "heterocycloalkyl group" refers to a cycloalkyl group having 1-4 or more heteroatoms as ring members instead of carbon; "heterocycloalkylene group" refers to a heterocycloalkyl group having a valence of two; "heteroaryl group" refers to an aryl group having 1-4 or more heteroatoms as ring members instead of carbon; and "heteroarylene group" refers to an heteroaryl group having a valence of two.

Each of the foregoing substituent groups optionally may be substituted unless expressly provided otherwise. For example, where the group is cited without specifying that it is substituted or unsubstituted, the group includes both a group having no substituent and a group having a substituent. The term "optionally substituted" refers to being substituted or unsubstituted.

"Substituted" means that at least one hydrogen atom of the chemical structure is replaced with another terminal substituent group that is typically monovalent, provided that the designated atom's normal valence is not exceeded. When the substituent is oxo (i.e., =O), then two geminal hydrogen atoms on the carbon atom are replaced with the terminal oxo group. Combinations of substituents or variables are permissible. Exemplary substituent groups that may be present on a "substituted" position include, but are not limited to, nitro ($—NO_2$), cyano (—CN), hydroxyl (—OH), oxo (=O), amino ($—NH_2$), mono- or di-($C_{1-6}$)alkylamino, alkanoyl (such as a $C_{2-6}$ alkanoyl group such as acyl), formyl (—C(=O)H), carboxylic acid or an alkali metal or ammonium salt thereof; esters (including acrylates, methacrylates, and lactones) such as $C_{2-6}$ alkyl esters (—C(=O)O-alkyl or —OC(=O)-alkyl) and $C_{7-13}$ aryl esters (—C(=O)O-aryl or —OC(=O)-aryl), amido (—C(=O)$NR_2$ wherein R is hydrogen or $C_{1-6}$ alkyl), carboxamido ($—CH_2C(=O)NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{2-18}$ heterocycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{3-12}$ heterocycloalkyl, $C_{3-12}$ heteroaryl, $C_{1-6}$ alkyl sulfonyl ($—S(=O)_2$-alkyl), $C_{6-12}$ arylsulfonyl ($—S(=O)_2$-aryl), or tosyl ($CH_3C_6H_4SO_2—$).

The term "halogen" means a monovalent substituent that is fluorine (fluoro), chlorine (chloro), bromine (bromo), or iodine (iodo). The prefix "halo" means a group including one or more of a fluoro, chloro, bromo, or iodo substituent instead of a hydrogen atom. A combination of halo groups (e.g., bromo and fluoro), or only fluoro groups may be present.

As used herein, an "acid-labile group" refers to a group in which a bond is cleaved by the action of an acid, optionally and typically with thermal treatment, resulting in formation of a polar group, such as a carboxylic acid or alcohol group, being formed on the polymer, and optionally and typically with a moiety connected to the cleaved bond becoming disconnected from the polymer. In other systems, a non-polymeric compound may include an acid-labile group that may be cleaved by the action of an acid, resulting in formation of a polar group, such as a carboxylic acid or alcohol group on a cleaved portion of the non-polymeric compound. Such acid is typically a photo-generated acid with bond cleavage occurring during post-exposure baking (PEB); however, embodiments are not limited thereto, and, for example, such acid may be thermally generated. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

As used herein, when a definition is not otherwise provided, a "divalent linking group" refers to a divalent group including one or more of —O—, —S—, —Te—, —Se—, —C(O)—, —N($R^b$)—, —S(O)—, —S(O)$_2$—, —C(S)—, —C(Te)—, —C(Se)—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein $R^b$ is hydrogen, substituted or unsubstituted $C_{1-20}$ alkyl, substituted or unsubstituted $C_{1-20}$ heteroalkyl, substituted or unsubstituted $C_{6-30}$ aryl, or substituted or unsubstituted $C_{3-30}$ heteroaryl. Typically, the divalent linking group includes one or more of —O—, —S—, —C(O)—, —N($R^b$)—, —S(O)—, —S(O)$_2$—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein $R^b$ is hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. More typically, the divalent linking group includes at least one of —O—, —C(O)—, —C(O)O—, —N($R^b$)—, —C(O)N($R^b$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein $R^b$ is hydrogen, substituted or unsubstituted $C_{1-10}$ alkyl, substituted or unsubstituted $C_{1-10}$ heteroalkyl, substituted or unsubstituted $C_{6-10}$ aryl, or substituted or unsubstituted $C_{3-10}$ heteroaryl.

The present disclosure relates to polymers having a repeating unit that includes a sulfone group, where the sulfone group is covalently bonded directly to a divalent carbon atom and where the divalent carbon atom is bonded to at least one hydrogen atom. The direct covalent attachment of the sulfone group to the divalent carbon atom renders the proton attached thereto more acidic, which makes it prone to deprotonation in the presence of strong base, such as the common developer tetramethyl ammonium hydroxide used in lithography processes. While not being bound by any particular theory, it is believed that, when used in a photoresist composition, polymers from the invention can lead to reduced defects by producing more hydrophilic groups in the exposed regions as a result of reaction of the base-reactive groups during the alkaline development step. Further, increasing alkaline developer solubility may help in reducing bridge defects and/or pattern collapse.

An aspect provides a polymer that includes a first repeating unit including a sulfone group (—S(═O)$_2$—), wherein the sulfone group is directly bonded to a group of formula —C($R^a$)($R^b$)—; and a second repeating unit including an acid labile group, a base-decomposable group, a polar group, or a combination thereof.

In the group of formula —C($R^a$)($R^b$)—, $R^a$ and $R^b$ are each independently hydrogen, halogen, substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl, provided that at least one of $R^a$ and $R^b$ is hydrogen. Typically, $R^a$ and $R^b$ may each independently be hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-24}$ aryl, substituted or unsubstituted $C_{7-25}$ arylalkyl, substituted or unsubstituted $C_{7-25}$ alkylaryl, substituted or unsubstituted $C_{2-20}$ heteroaryl, substituted or unsubstituted $C_{3-20}$ heteroarylalkyl, or substituted or unsubstituted $C_{3-20}$ alkylheteroaryl, provided that at least one of $R^a$ and $R^b$ is hydrogen. Preferably, $R^a$ and $R^b$ may each independently be hydrogen, substituted or unsubstituted $C_{1-10}$ alkyl, substituted or unsubstituted $C_{3-10}$ cycloalkyl, substituted or unsubstituted $C_{3-10}$ heterocycloalkyl, substituted or unsubstituted $C_{6-24}$ aryl, or substituted or unsubstituted $C_{2-20}$ heteroaryl, provided that at least one of $R^a$ and $R^b$ is hydrogen.

In some aspects, the first repeating unit may be derived from a first monomer represented by Formula (1):

(1)

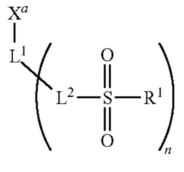

In Formula (1), $X^a$ is a polymerizable group including an ethylenically unsaturated carbon-carbon double bond. Typically, $X^a$ may be selected from a substituted or unsubstituted $C_{2-20}$ alkenyl group, a substituted or unsubstituted norbornyl group, a substituted or unsubstituted (meth)acrylic group, a substituted or unsubstituted vinyl ether group, a substituted or unsubstituted vinyl ketone group, a substituted or unsubstituted vinyl ester group, or a substituted or unsubstituted vinyl aromatic group. Preferably, $X^a$ is substituted or unsubstituted $C_{2-20}$ alkenyl, substituted or unsubstituted norbornyl, substituted or unsubstituted (meth)acrylic, or substituted or unsubstituted vinyl aromatic.

In Formula (1), $L^1$ is a single bond or a linking group. Typically, the linking group may include one or more of —O—, —S—, —C(O)—, —C(O)O—, —N($R^c$)—, —C(O)N($R^c$)—, —S(O)—, —$S(O)_2$—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein $R^c$ may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. Preferably, the linking group includes at least one of —O—, —C(O)—, —C(O)O—, —N($R^c$)—, —C(O)N($R^c$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein $R^c$ may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl.

In Formula (1), n is an integer from 1 to 5. Typically, n may be 1, 2, or 3. Preferably, n may be 1 or 2.

When $L^1$ is a linking group, then $L^1$ is a group having a valency of n+1. For example, $L^1$ is a divalent group when n is 1, or $L^1$ is a trivalent group when n is 2, or $L^1$ is a tetravalent group when n is 3, or $L^1$ is a pentavalent group when n is 4, or $L^1$ is a hexavalent group when n is 5.

In Formula (1), each $L^2$ is independently a single bond, substituted or unsubstituted $C_{1-30}$ alkylene, or substituted or unsubstituted $C_{3-30}$ cycloalkylene. Typically, $L^2$ may be a single bond, substituted or unsubstituted $C_{1-20}$ alkylene, or substituted or unsubstituted $C_{3-20}$ cycloalkylene. Preferably, $L^2$ may be substituted or unsubstituted $C_{1-10}$ alkylene or substituted or unsubstituted $C_{3-10}$ cycloalkylene.

In Formula (1), $L^1$ and $L^2$ may not be a single bond at the same time. In other words, at least one of $L^1$ and $L^2$ is not a single bond.

In Formula (1), each $R^1$ is independently substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. Typically, each $R^1$ may be independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. Preferably, each $R^1$ may be independently substituted or unsubstituted $C_{1-10}$ alkyl, substituted or unsubstituted $C_{3-10}$ cycloalkyl, substituted or unsubstituted $C_{3-10}$ heterocycloalkyl, substituted or unsubstituted $C_{6-24}$ aryl, substituted or unsubstituted $C_{7-25}$ arylalkyl, substituted or unsubstituted $C_{7-25}$ alkylaryl, substituted or unsubstituted $C_{2-20}$ heteroaryl, substituted or unsubstituted $C_{3-20}$ heteroarylalkyl, or substituted or unsubstituted $C_{3-20}$ alkylheteroaryl.

In Formula (1), each $R^1$ may independently further include a divalent linking group as part of its structure. For example, each $R^1$ may independently further include as part of its structure one or more groups selected from —O—, —C(O)—, —C(O)O—, —S—, —$S(O)_2$—, —N($R^c$)—, or —C(O)N($R^c$)— wherein $R^c$ is hydrogen, substituted or unsubstituted $C_{1-20}$ alkyl, substituted or unsubstituted $C_{3-20}$ cycloalkyl, or substituted or unsubstituted $C_{3-2}$ heterocycloalkyl.

In Formula (1), at least one $L^2$ or at least one $R^1$ includes the group of formula —C($R^a$)($R^b$)— that is directly bonded to —S(=O)$_2$—. In other words, when n is 1, then at least one of $L^2$ and $R^1$ includes the group of formula —C($R^a$)($R^b$)— that is directly bonded to —S(=O)$_2$—. However, when n is 2 or greater, at least one $L^2$ or at least one $R^1$ includes the group of formula —C($R^a$)($R^b$)— that is directly bonded to —S(=O)$_2$—, such that at least one unit represented by n includes the at least one of $L^2$ and $R^1$ that includes the group of formula —C($R^a$)($R^b$)— that is directly bonded to —S(=O)$_2$—, whereas the other units represented by n are not required to satisfy this limitation. For example, at least one $L^2$ may include the group of formula —C($R^a$)($R^b$)— that is directly bonded to —S(=O)$_2$—. For example, at least one $R^1$ may include the group of formula —C($R^a$)($R^b$)— that is directly bonded to —S(=O)$_2$—. Or, for example, one $L^2$ or one $R^1$ may include a group of formula —C($R^a$)($R^b$)— that is directly bonded to —S(=O)$_2$—.

In some aspects, when n is 1, the first repeating unit may be derived from a first monomer represented by Formula (2):

(2)

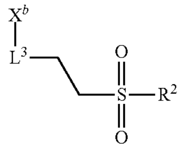

In Formula (2), $X^b$ is a polymerizable group comprising an ethylenically unsaturated carbon-carbon double bond. Typically, $X^b$ may be selected from a substituted or unsubstituted $C_2$-20 alkenyl group, a substituted or unsubstituted norbornyl group, a substituted or unsubstituted (meth)acrylic group, a substituted or unsubstituted vinyl ether group, a substituted or unsubstituted vinyl ketone group, a substituted or unsubstituted vinyl ester group, or a substituted or unsubstituted vinyl aromatic group. Preferably, $X^b$ is substituted or unsubstituted $C_{2-20}$ alkenyl, substituted or unsubstituted norbornyl, substituted or unsubstituted (meth)acrylic, or substituted or unsubstituted vinyl aromatic.

In Formula (2), $L^3$ is a single bond or a divalent linking group. Typically, $L^3$ may be a single bond or a linking group including at least one of —O—, —C(O)—, —C(O)O—, —N($R^c$)—, —C(O)N($R^c$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein $R^c$ may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-3}$ heteroarylalkyl, or substituted or unsubstituted $C_{3-30}$ alkylheteroaryl.

In Formula (2), $R^2$ is the same as defined herein for $R^1$ in Formula (1) Typically, $R^2$ may be substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. Preferably, $R^2$ may be substituted or unsubstituted $C_{1-20}$ alkyl, substituted or unsubstituted $C_{3-2}$ cycloalkyl, substituted or unsubstituted $C_{3-20}$ heterocycloalkyl, substituted or unsubstituted $C_{6-24}$ aryl, substituted or unsubstituted $C_{7-25}$ arylalkyl, substituted or unsubstituted $C_{7-25}$ alkylaryl, substituted or unsubstituted $C_{2-20}$ heteroaryl, substituted or unsubstituted $C_{3-20}$ heteroarylalkyl, or substituted or unsubstituted $C_{3-20}$ alkylheteroaryl.

In some embodiments, $R^2$ may further include a divalent linking group as part of its structure. For example, $R^2$ may further include as part of its structure one or more groups selected from —O—, —C(O)—, —C(O)O—, —S—, —S(O)$_2$—, —N($R^c$)—, or —C(O)N($R^c$)— wherein $R^c$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In some aspects, when n is 2, the first repeating unit may be derived from a first monomer represented by Formula (3):

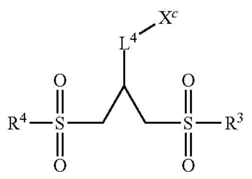
(3)

In Formula (3), $X^c$ is a polymerizable group comprising an ethylenically unsaturated carbon-carbon double bond. Typically, $X^c$ may be selected from a substituted or unsubstituted $C_{2-20}$ alkenyl group, a substituted or unsubstituted norbornyl group, a substituted or unsubstituted (meth) acrylic group, a substituted or unsubstituted vinyl ether group, a substituted or unsubstituted vinyl ketone group, a substituted or unsubstituted vinyl ester group, or a substituted or unsubstituted vinyl aromatic group. Preferably, $X^c$ is substituted or unsubstituted $C_{2-20}$ alkenyl, substituted or unsubstituted norbornyl, substituted or unsubstituted (meth) acrylic, or substituted or unsubstituted vinyl aromatic.

In Formula (3), $L^4$ is a single bond or a divalent linking group. Typically, $L^4$ may be a single bond or a linking group including at least one of —O—, —C(O)—, —C(O)O—, —N($R^c$)—, —C(O)N($R^c$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein $R^c$ may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl.

In Formula (3), $R^3$ and $R^4$ are each independently the same as defined herein for $R^1$. Typically, $R^3$ and $R^4$ may each independently be substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. Preferably, $R^3$ and $R^4$ may each independently be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-24}$ aryl, substituted or unsubstituted $C_{7-25}$ arylalkyl, substituted or unsubstituted $C_{7-25}$ alkylaryl, substituted or unsubstituted $C_{2-20}$ heteroaryl, substituted or unsubstituted $C_{3-20}$ heteroarylalkyl, or substituted or unsubstituted $C_{3-20}$ alkylheteroaryl.

In some embodiments, $R^3$ and/or $R^4$ may further include a divalent linking group as part of its structure. For example, $R^3$ and/or $R^4$ independently may further include as part of its structure one or more groups selected from —O—, —C(O)—, —C(O)O—, —S—, —S(O)$_2$—, —N($R^c$)—, or —C(O)N($R^c$)— wherein $R^c$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In some aspects, the first repeating unit may be derived from a first monomer that includes a (meth)acryloyl group or a vinyl aromatic group. In other words, in some aspects, the polymerizable group $X^a$, $X^b$, and/or $X^c$ may be a (meth) acrylic group or a vinyl aromatic group.

For example, in some aspects the first repeating unit may be derived from a first monomer that is selected from one or more of Formulae (4) to (7):

(4)

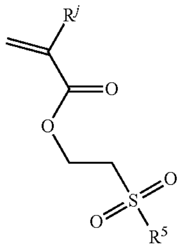

(5)

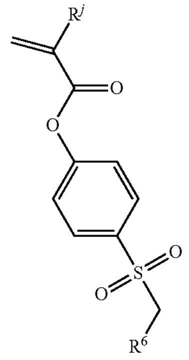

(6)

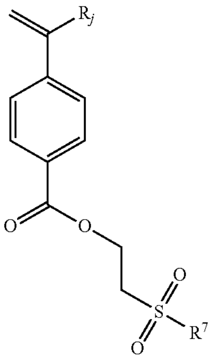

(7)

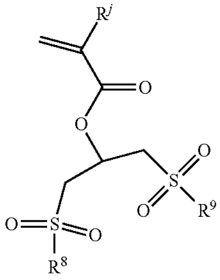

In Formulae (4) to (7), each $R^j$ is independently hydrogen, fluorine, cyano, substituted or unsubstituted $C_{1-10}$ alkyl, or substituted or unsubstituted $C_{1-10}$ fluoroalkyl. Preferably, $R^j$ is hydrogen or substituted or unsubstituted $C_{1-5}$ alkyl, typically methyl. $R^5$ to $R^9$ are each independently substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. Preferably, $R^5$ to $R^9$ may each independently be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-24}$ aryl, substituted or unsubstituted $C_{7-25}$ arylalkyl, substituted or unsubstituted $C_{7-25}$ alkylaryl, substituted or unsubstituted $C_{2-20}$ heteroaryl, substituted or unsubstituted $C_{3-20}$ heteroarylalkyl, or substituted or unsubstituted $C_{3-20}$ alkylheteroaryl.

In Formulae (4) to (7), $R^5$ to $R^9$ may further include a divalent linking group as part of its structure. For example, $R^5$ to $R^9$ may each independently include as part of its structure one or more groups selected from —O—, —C(O)—, —C(O)O—, —S—, —$S(O)_2$—, —$N(R^c)$—, or —$C(O)N(R^c)$— wherein $R^c$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

Non-limiting examples of the first monomer may include one or more of the following:

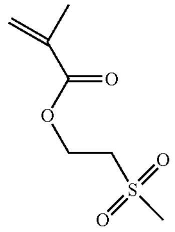
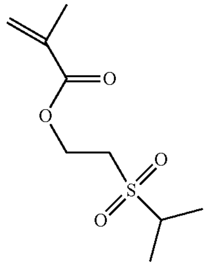
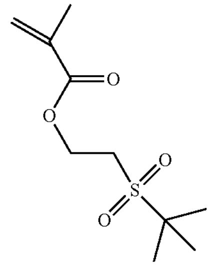
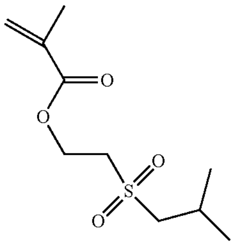
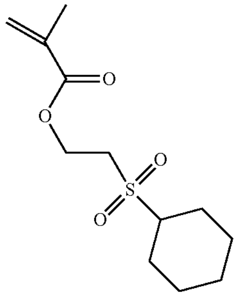
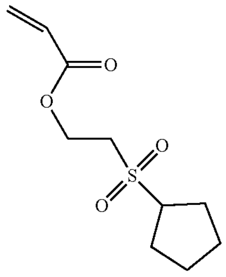
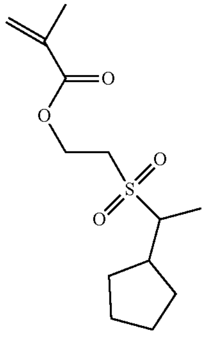
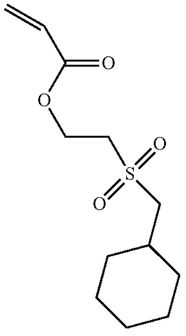

-continued
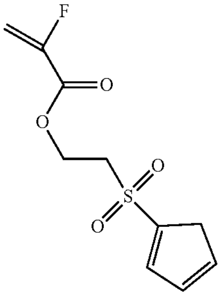
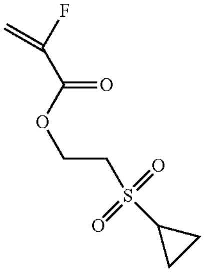
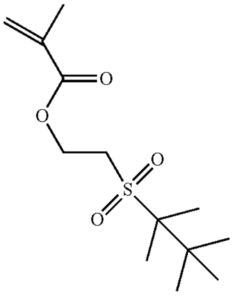
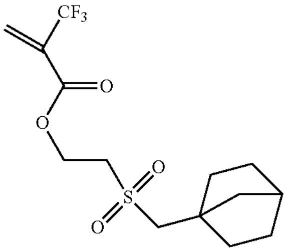
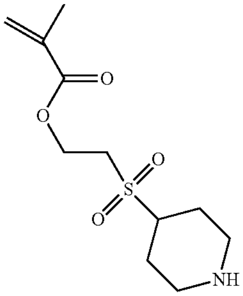
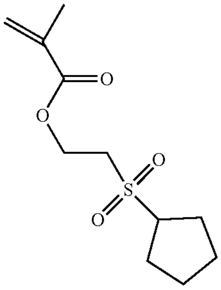
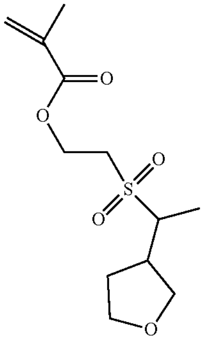
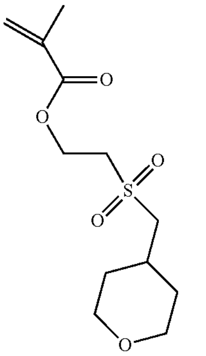
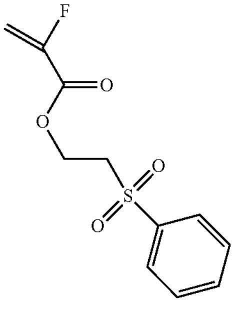
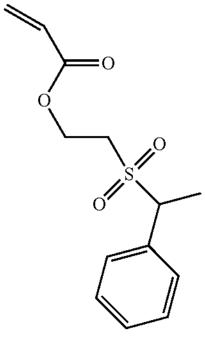
-continued
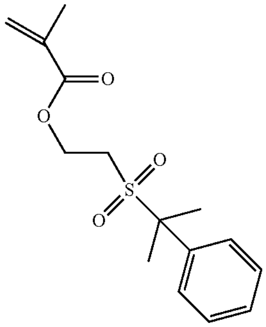
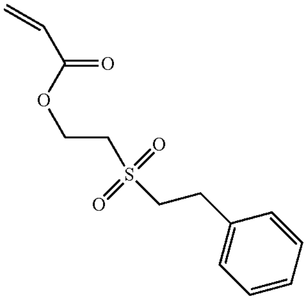
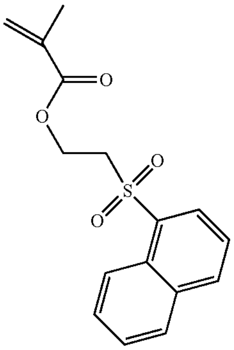
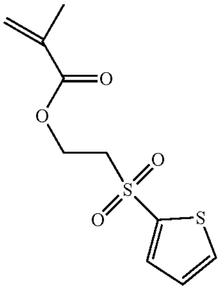
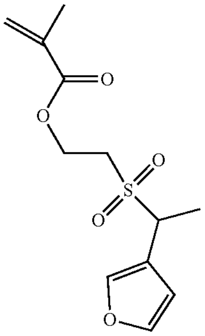
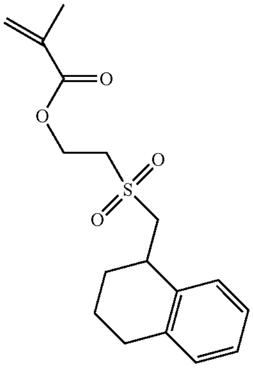
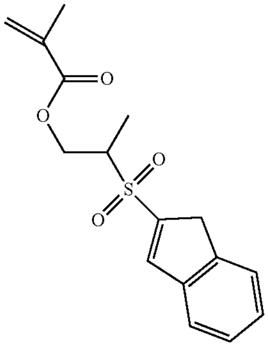
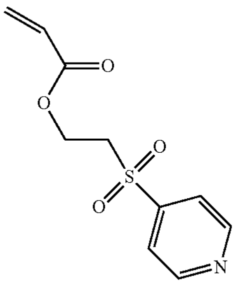

-continued
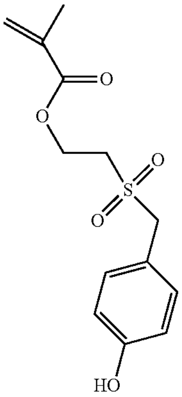
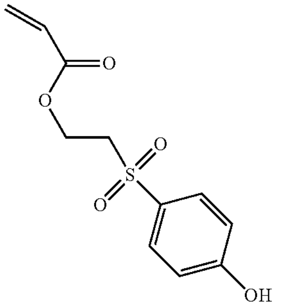
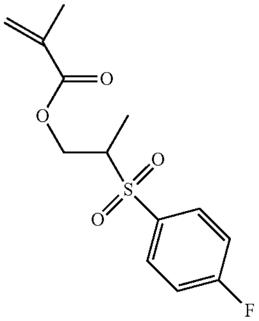
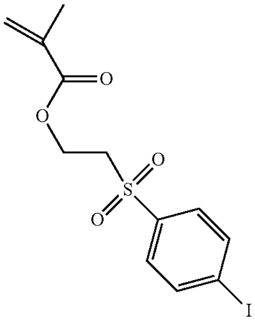
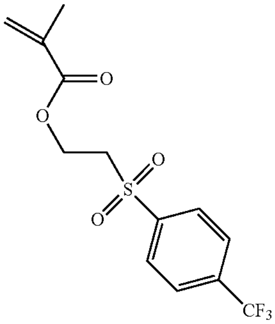
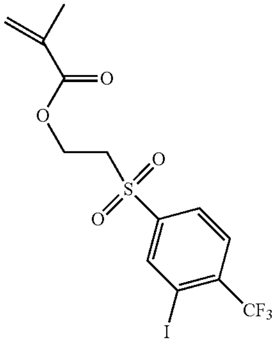
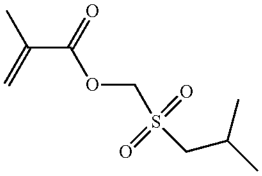
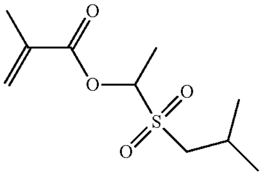
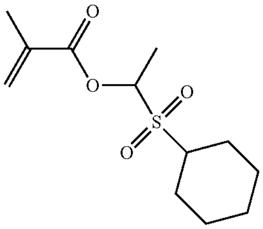
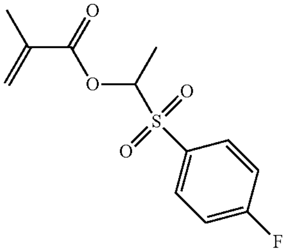
-continued
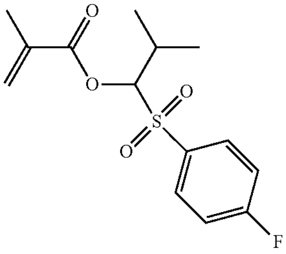
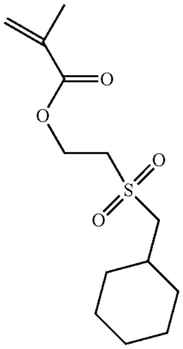
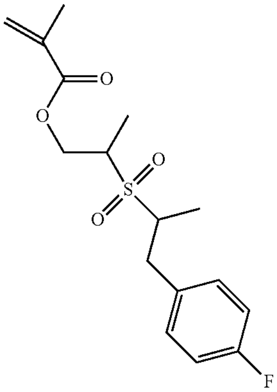
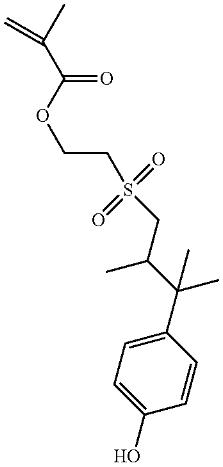
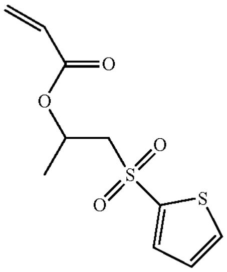
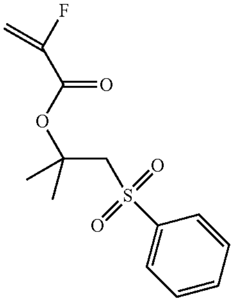
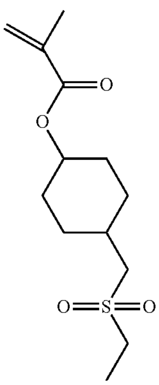
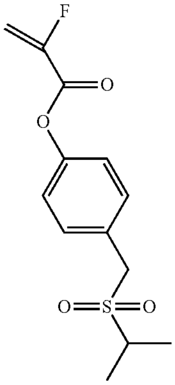

-continued
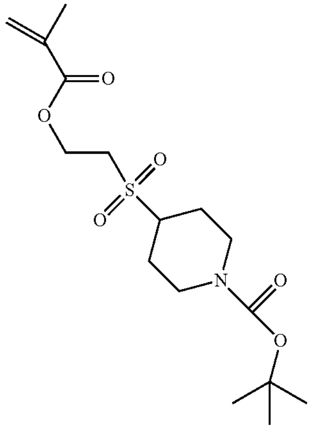
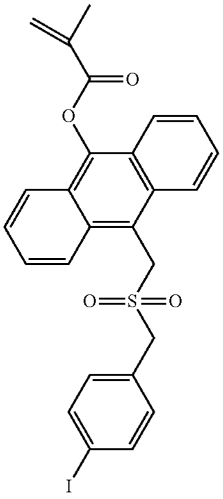
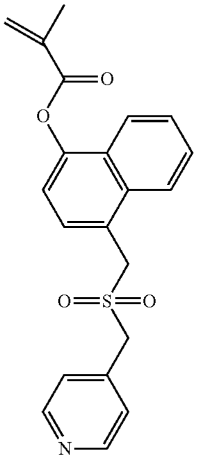
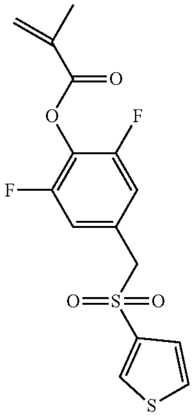
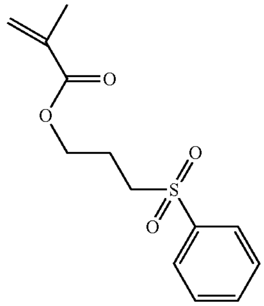
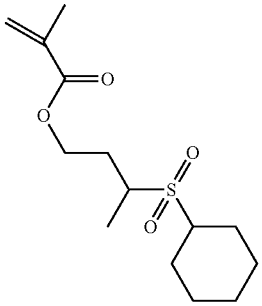
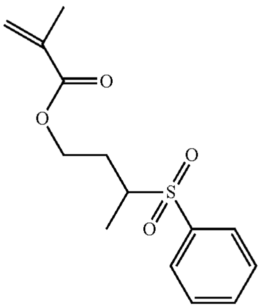
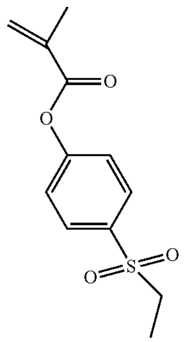
-continued
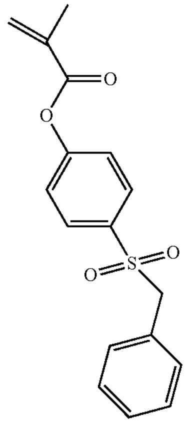
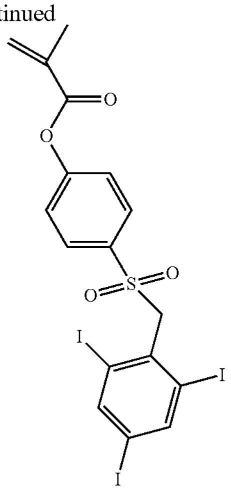
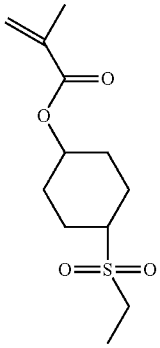
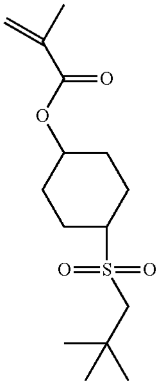
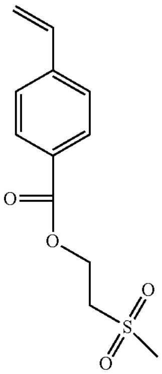
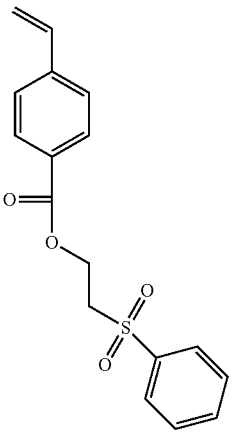
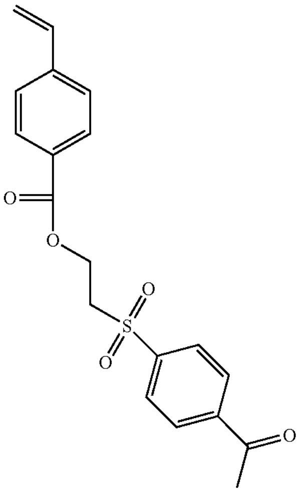

-continued
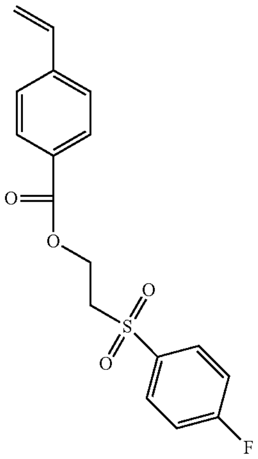
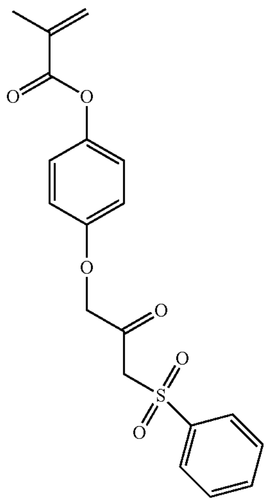
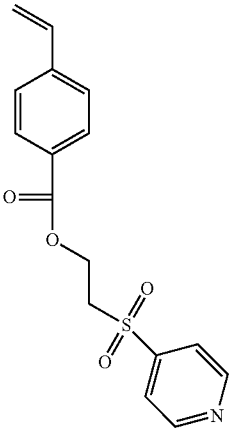
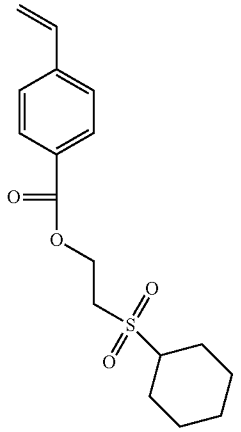
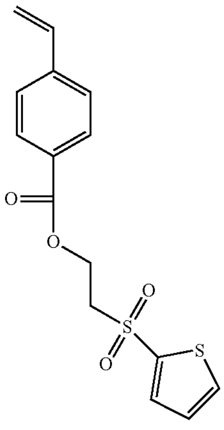
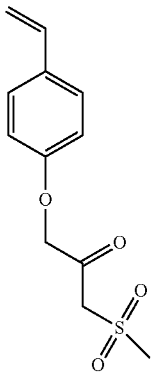
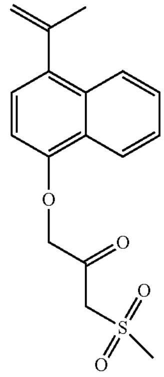
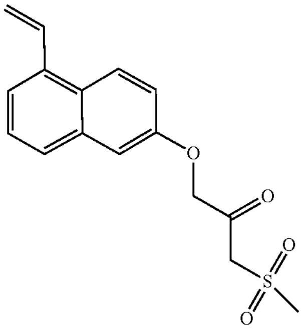
-continued
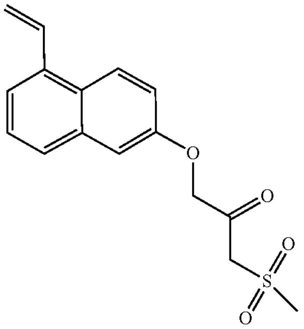
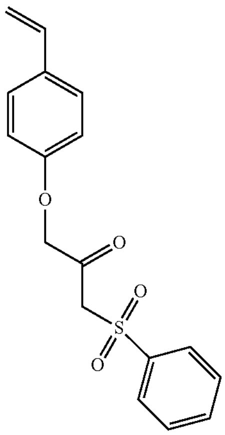
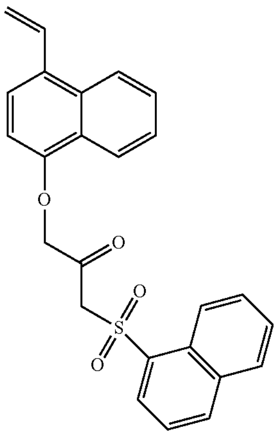
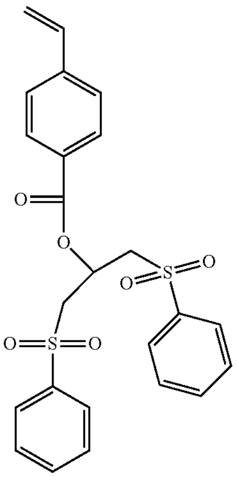
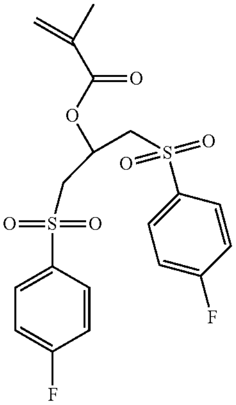

-continued
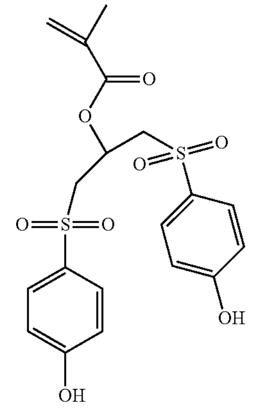
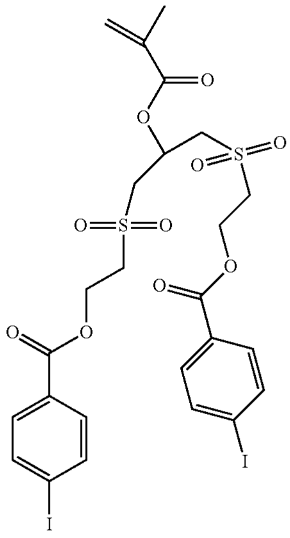
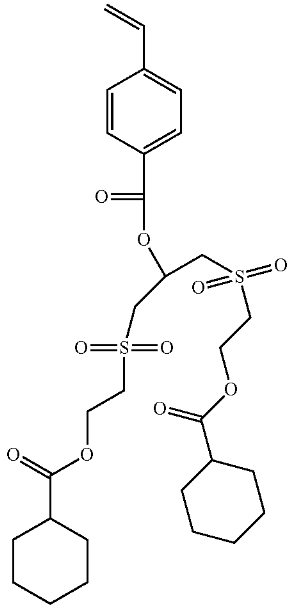
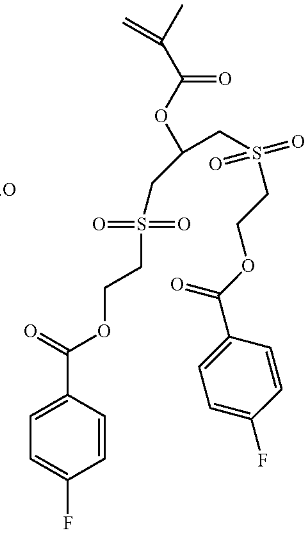
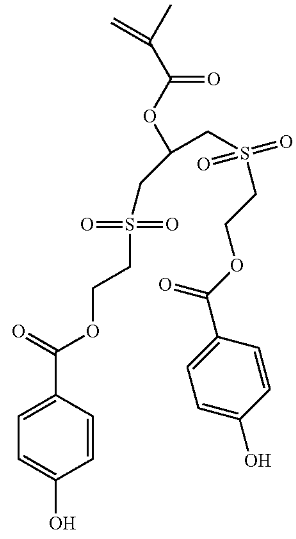
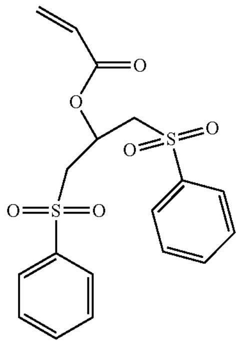
-continued
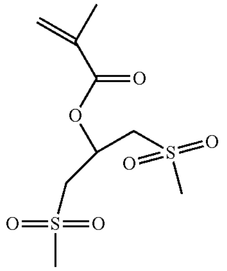
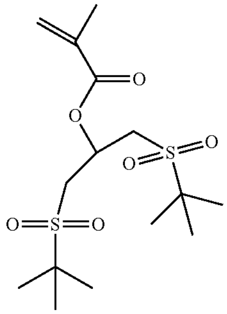
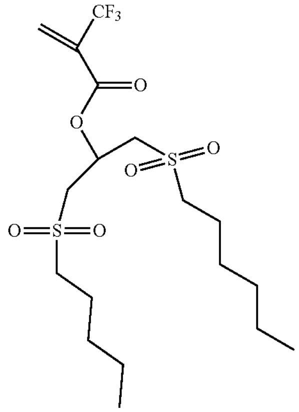
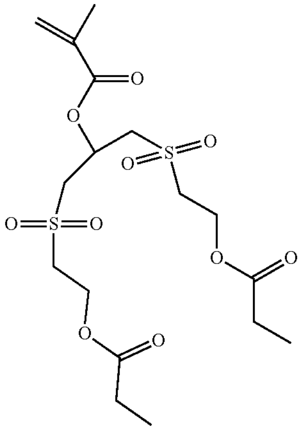
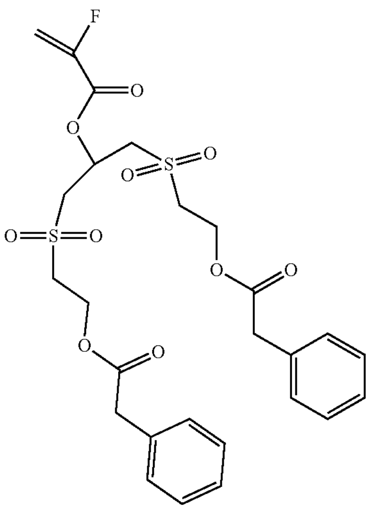

-continued
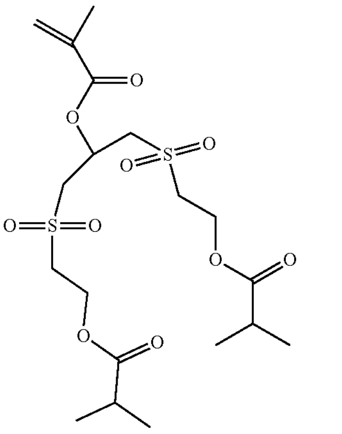
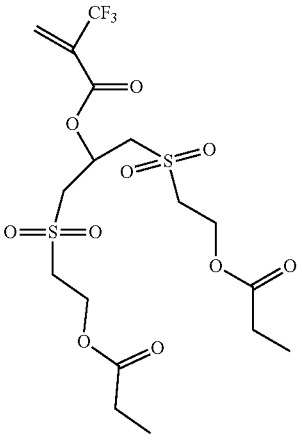
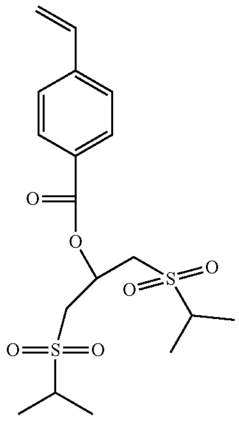
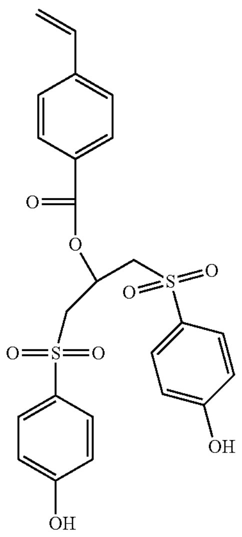
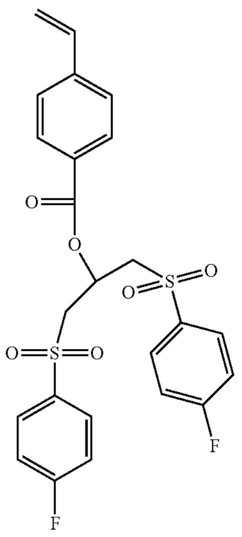
-continued
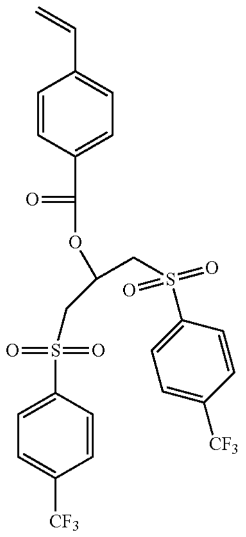
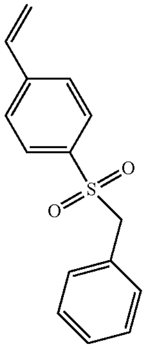
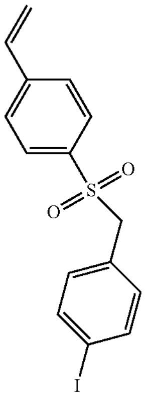
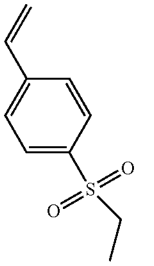
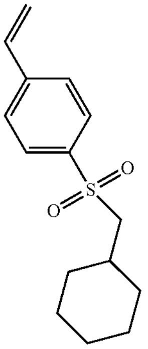
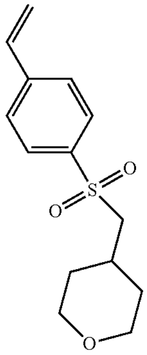
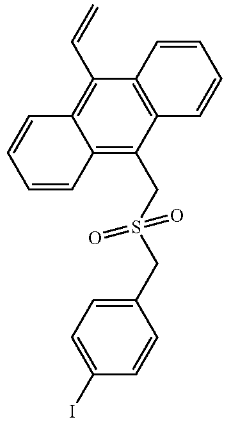
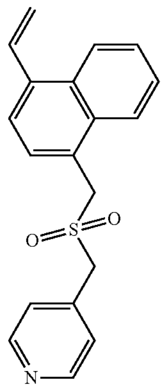

-continued
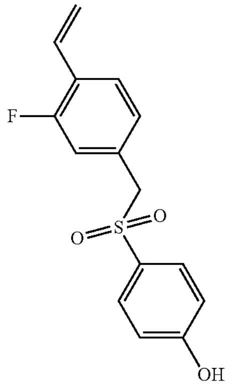
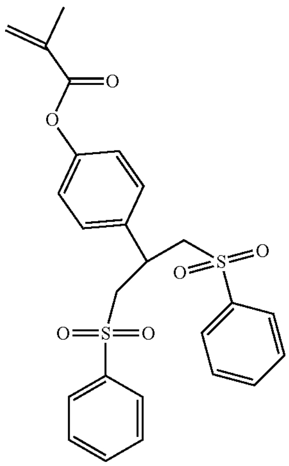
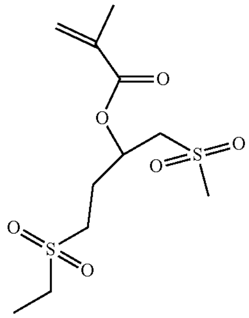
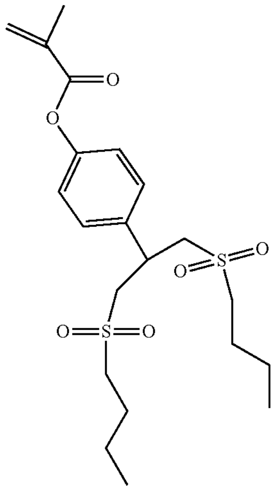
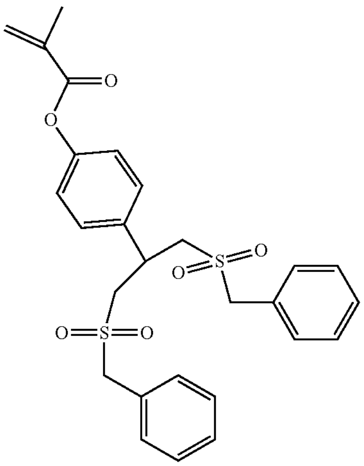
-continued
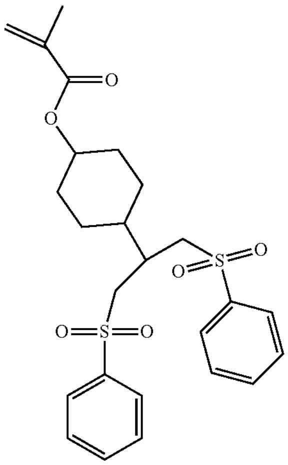
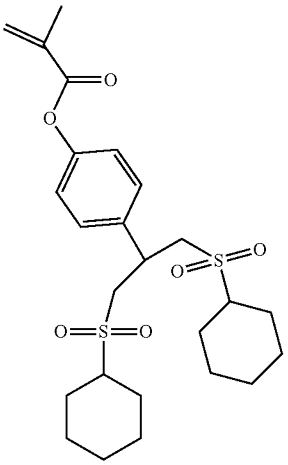
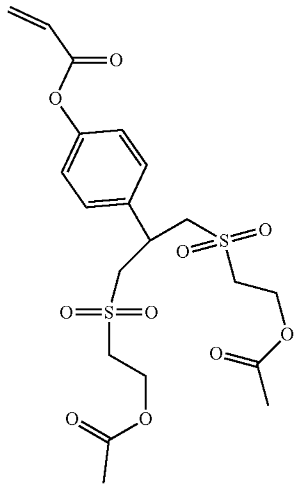
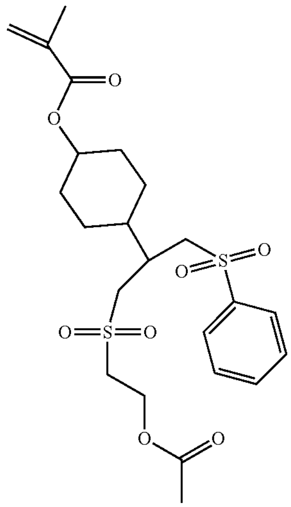

-continued

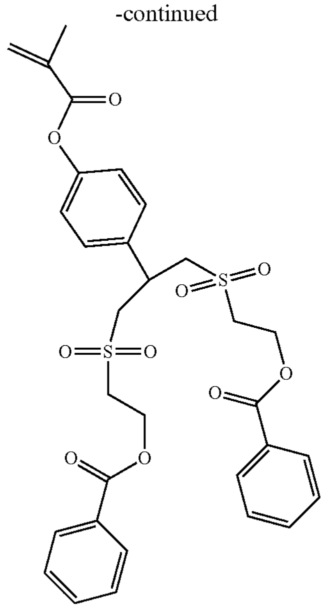

The first repeating unit of the polymer is typically present in an amount from 5 to 100 mole percent (mol %), more typically from 5 to 50 mol %, more typically from 5 to 25 mol %, and still more typically from 5 to 15 mol %, based on total repeating units of the polymer.

The polymer may further include a second repeating unit including an acid labile group, a base-decomposable group, a polar group, or a combination thereof. In one or more embodiments, the second repeating unit may include an acid labile group, a hydroxyaryl group, a fluoroalcohol group, a sulfonamide group, a lactone group, or a combination thereof. For example, the polymer may include a second repeating unit including an acid labile group, a hydroxyaryl group, a sulfonamide group, a fluoroalcohol, or a lactone group. In some aspects, the second repeating unit includes an acid labile group.

Suitable acid labile groups include, for example, tertiary alkyl ester groups, secondary or tertiary aryl ester groups, secondary or tertiary ester groups having a combination of alkyl and aryl groups, tertiary alkoxy groups, acetal groups, ketal groups, tertiary carbonate groups, and tertiary carbamate groups. Typically, the acid labile group may be an acetal group, a ketal group, a tertiary carbonate group, a tertiary carbamate group, or a tertiary ester group. As used herein, the "tertiary carbamate group" includes tertiary carbamate ester groups having alkyl groups, tertiary carbamate ester groups having aryl groups, and tertiary carbamate ester groups having a combination of alkyl and aryl groups. As used herein, the "tertiary carbonate group" includes tertiary carbonate ester groups having alkyl groups, tertiary carbonate ester groups having aryl groups, and tertiary carbonate ester groups having a combination of alkyl and aryl groups. Preferably, the acid liable group of the second repeating unit includes a tertiary ester group.

The second repeating unit of the polymer may include an acid labile group that is derived from one or more monomers of Formulae (8), (9), (10), (11), and/or (12):

(8)

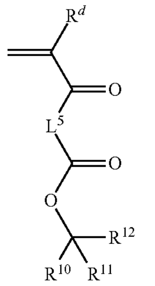

(9)

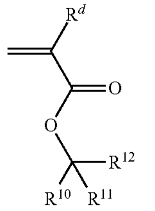

(10)

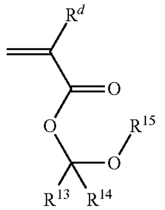

(11)

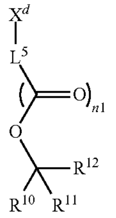

(12)

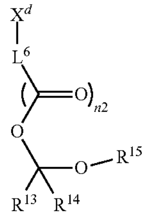

In Formulae (8) to (12), each $R^d$ is independently hydrogen, fluorine, cyano, substituted or unsubstituted $C_{1-10}$ alkyl, or substituted or unsubstituted $C_{1-10}$ fluoroalkyl. Preferably, $R^d$ is hydrogen, fluorine, or substituted or unsubstituted $C_{1-5}$ alkyl, typically methyl.

In Formula (8), $L^5$ is a divalent linking group. For example, $L^5$ may be a divalent linking group including at least one carbon atom, at least one heteroatom, or a combination thereof. For example, $L^5$ may include 1 to 10 carbon atoms and at least one heteroatom. In one or more embodiments, $L^5$ may be $-OCH_2-$, $-OCH_2CH_2O-$ or $-N(R^c)-$, wherein $R^c$ is hydrogen, substituted or unsubstituted $C_{1-10}$ alkyl, substituted or unsubstituted $C_{1-10}$ heteroalkyl, substituted or unsubstituted $C_{6-10}$ aryl, or substituted or unsubstituted $C_{3-10}$ heteroaryl.

In Formulae (8), (9), and (11), $R^{10}$ to $R^{12}$ may each independently be hydrogen, substituted or unsubstituted $C_{1-20}$ alkyl, substituted or unsubstituted $C_{3-20}$ cycloalkyl, substituted or unsubstituted $C_{1-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{2-20}$ heteroaryl; provided that only one of $R^{10}$ to $R^{12}$ may be hydrogen, and provided that when one of $R^{10}$ to $R^{12}$ is hydrogen, one or both of the others of $R^{10}$ to $R^{12}$ are substituted or unsubstituted $C_{6-20}$ aryl or substituted or unsubstituted $C_{4-20}$ heteroaryl. Preferably, $R^{10}$ to $R^{12}$ are each independently substituted or unsubstituted $C_{1-6}$ alkyl or substituted or unsubstituted $C_{3-10}$ cycloalkyl.

In Formula (8), any two of $R^{10}$ to $R^{12}$ together optionally form a ring, and each of $R^{10}$ to $R^{12}$ optionally may include as part of their structure one or more groups chosen from —O—, —C(O)—, —S—, or —$S(O)_2$—, wherein $R^c$ may be hydrogen, a straight chain or branched $C_{1-20}$ alkyl, monocyclic or polycyclic $C_{3-20}$ cycloalkyl, or monocyclic or polycyclic $C_{1-20}$ heterocycloalkyl. For example, any one or more of $R^{10}$ to $R^{12}$ may be independently a group of the formula —$CH_2C(=O)CH_{(3-n)}Y_n$, where each Y is independently substituted or unsubstituted $C_{1-30}$ heterocycloalkyl, and n is 1 or 2. For example, each Y may be independently substituted or unsubstituted $C_{1-30}$ heterocycloalkyl including a group of the formula —$O(C^{a1})(C^{a2})O$—, wherein $C^{a1}$ and $C^{a2}$ are each independently hydrogen or substituted or unsubstituted $C_{1-10}$ alkyl, and where $C^{a1}$ and $C^{a2}$ together optionally form a ring.

In Formulae (10) and (12), $R^{13}$ and $R^{14}$ may be each independently hydrogen, substituted or unsubstituted $C_{1-20}$ alkyl, substituted or unsubstituted $C_{3-20}$ cycloalkyl, substituted or unsubstituted $C_{1-20}$ heterocycloalkyl, substituted or unsubstituted $C_{6-20}$ aryl, or substituted or unsubstituted $C_{2-20}$ heteroaryl; and $R^{15}$ may be substituted or unsubstituted $C_{1-20}$ alkyl, substituted or unsubstituted $C_{3-20}$ cycloalkyl, or substituted or unsubstituted $C_{1-30}$ heterocycloalkyl. Optionally, one of $R^{13}$ or $R^{14}$ together with $R^{15}$ may form a heterocyclic ring. Preferably, $R^{13}$ and $R^{14}$ may be each independently hydrogen, substituted or unsubstituted $C_{1-20}$ alkyl, substituted or unsubstituted $C_{3-20}$ cycloalkyl, or substituted or unsubstituted $C_{1-20}$ heterocycloalkyl.

In Formulae (11) and (12), each $X^d$ is independently a polymerizable group selected from vinyl and norbornyl; and $L^5$ and $L^6$ are each independently a single bond or a divalent linking group, provided that $L^5$ and $L^6$ may not be a single bond when $X^d$ is vinyl. Preferably, $L^5$ and $L^6$ are each independently substituted or unsubstituted $C_{6-30}$ arylene or substituted or unsubstituted $C_{3-30}$ cycloalkylene.

In Formulae (11) and (12), each of n1 and n2 may independently be 0 or 1. It is to be understood that when n1 or n2 is 0, the corresponding $L^5$ or $L^6$ group is connected directly to the respective oxygen atom.

Non-limiting examples of monomers for providing the second repeating unit including an acid labile group include the following:

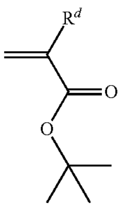
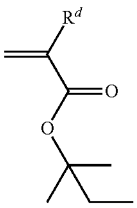
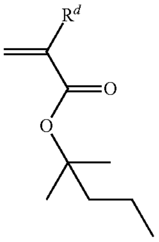

-continued

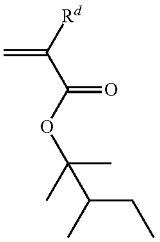
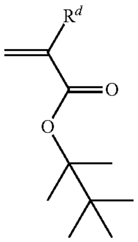
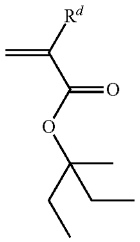
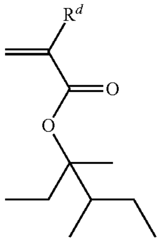
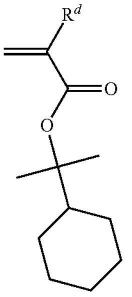
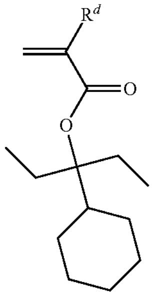
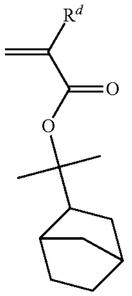
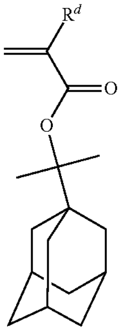
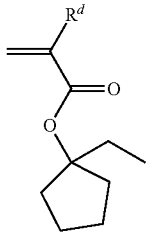
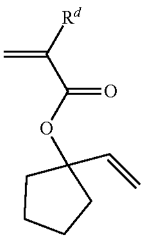
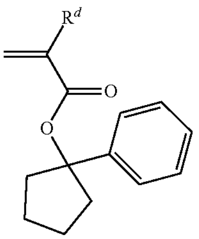
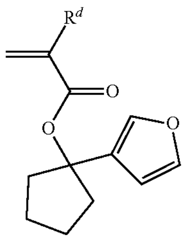
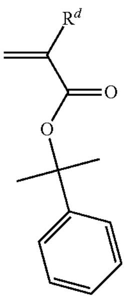
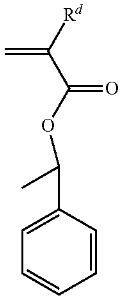
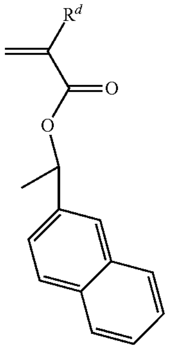

-continued
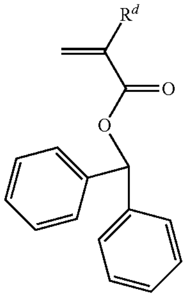
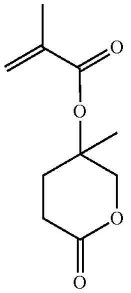
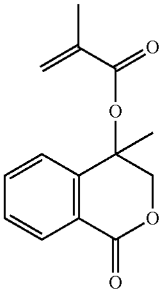
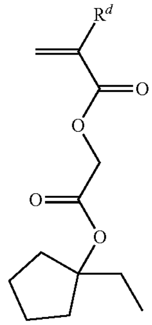
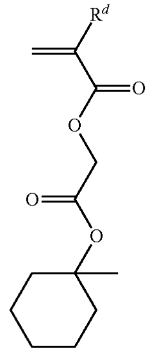
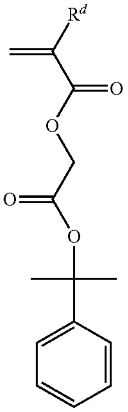
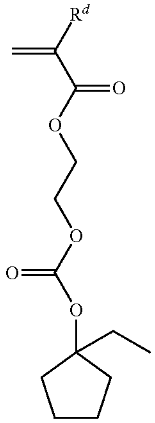
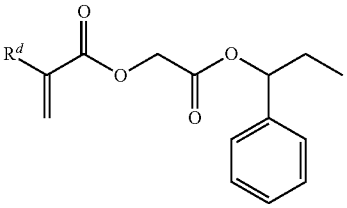
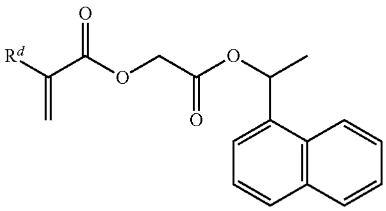
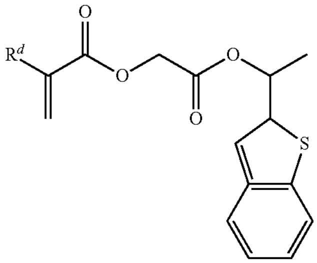
-continued
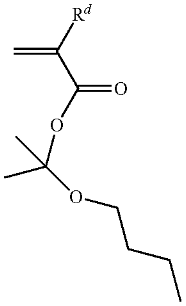
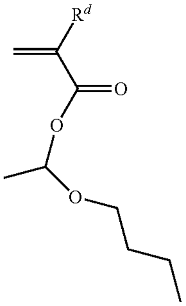
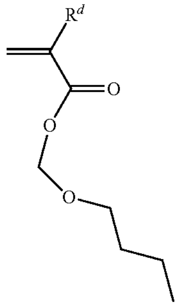
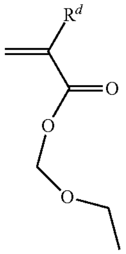
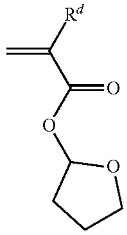
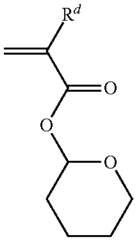
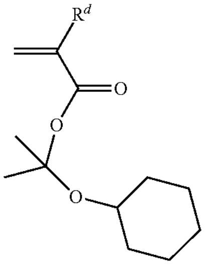
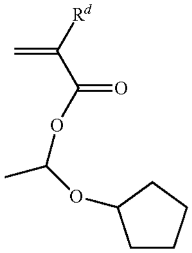
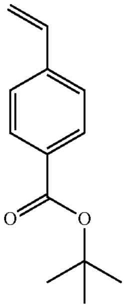
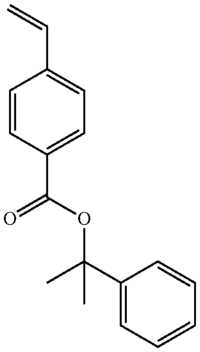
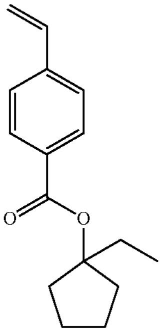
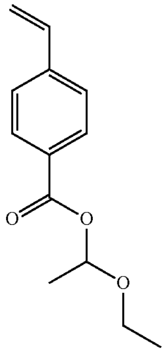
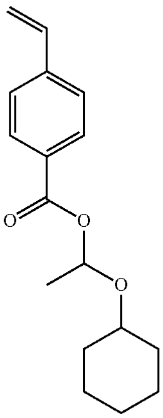
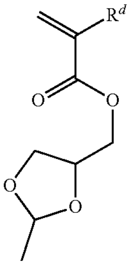
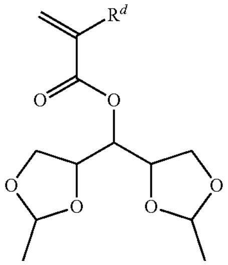

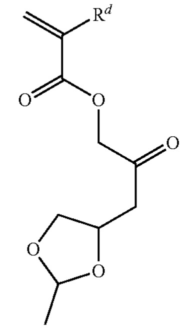
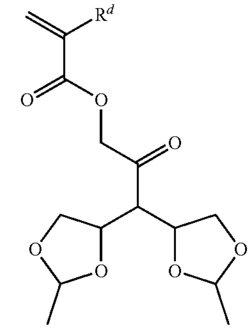
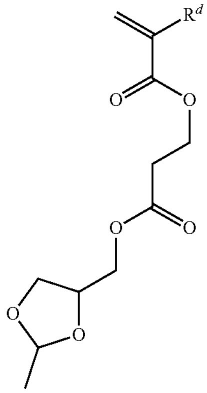
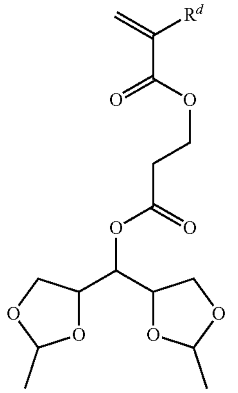
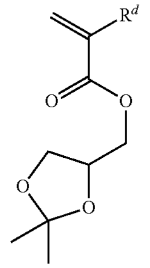
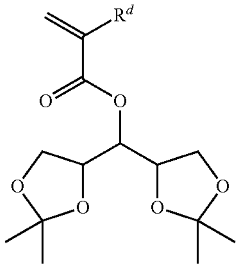
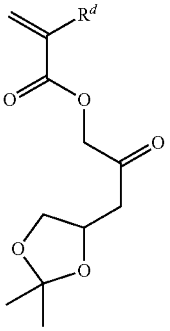
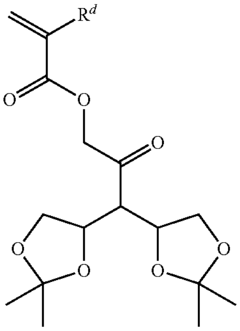
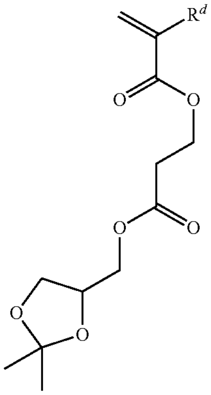
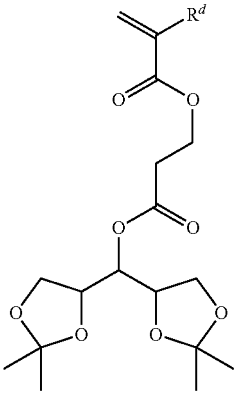
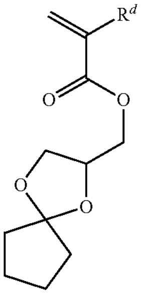
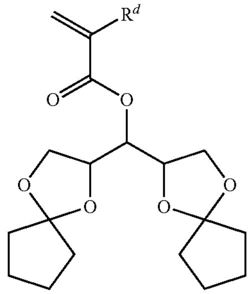
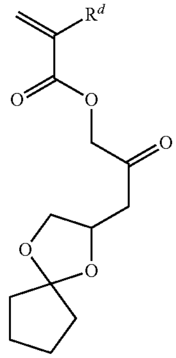
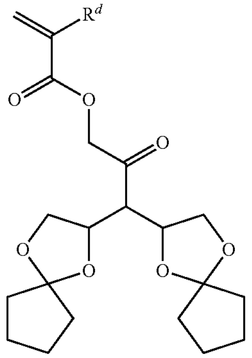
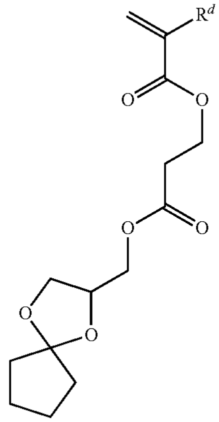
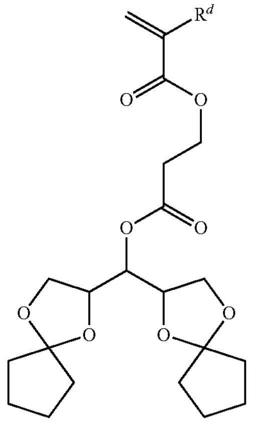
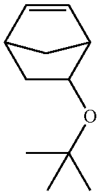
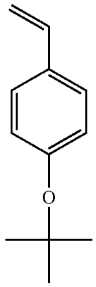
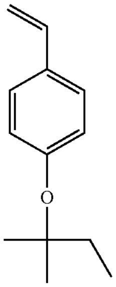
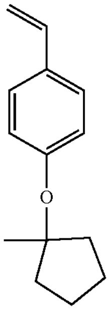
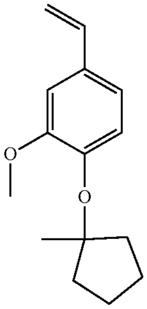
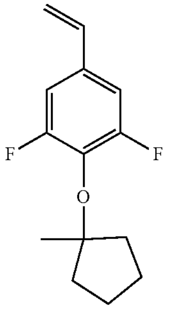

wherein $R^d$ is hydrogen, halogen, substituted or unsubstituted $C_{1-6}$ alkyl, or substituted or unsubstituted $C_{3-6}$ cycloalkyl.

The second repeating unit may include a base-decomposable group. Exemplary base-decomposable groups include a hydroxyaryl group, a fluoroalcohol group (e.g., —$C(CF_3)_2OH$), a sulfonamide group (e.g., —$NHSO_2CF_3$), or a combination thereof.

As used herein, a "hydroxyaryl group" refers to an aryl group in which hydroxy is bonded directly to an aromatic ring carbon. "Hydroxy" shall be understood to mean having one or more hydroxy groups incorporated into the group. For example, where a $C_{6-12}$ hydroxy-aryl group is indicated, the hydroxy-aryl group can include one or more hydroxy groups, for example, a single hydroxy group, two hydroxy groups, three or more hydroxy groups, or the like.

The second repeating unit may include a polar group. Exemplary polar groups include a lactone group, a sultone group, a hydroxyaryl group, a hydroxyalkyl group, or a combination thereof. It is to be understood that some groups, such as the hydroxyaryl group, may be considered a base-decomposable group and a polar group. In other words, some base-decomposable groups may also be polar groups.

For example, the second repeating unit may include a repeating unit of Formulae (13), (14), or a combination thereof:

(13)

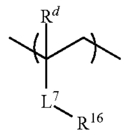

(14)

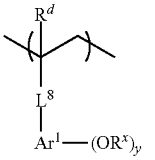

In Formulae (13) and (14), each $R^d$ may be hydrogen, fluorine, cyano, or substituted or unsubstituted $C_{1-10}$ alkyl. Preferably, $R^d$ may be hydrogen, fluorine, or substituted or unsubstituted $C_{1-5}$ alkyl, typically hydrogen or methyl.

In Formulae (13) and (14), $L^7$ and $L^8$ may each independently be a single bond or one or more divalent linking groups. For example, $L^7$ and $L^8$ may each independently be —O—, —C(O)—, —C(O)O—, —N($R^b$)—, —C(O)N($R^c$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein $R^c$ may be hydrogen, substituted or unsubstituted $C_{1-30}$ alkyl, substituted or unsubstituted $C_{1-30}$ heteroalkyl, substituted or unsubstituted $C_{3-30}$ cycloalkyl, substituted or unsubstituted $C_{1-30}$ heterocycloalkyl, substituted or unsubstituted $C_{2-30}$ alkenyl, substituted or unsubstituted $C_{2-30}$ alkynyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl. In some aspects, $L^7$ and $L^8$ may each independently be a single bond, or one or more groups selected from —C(O)O—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof.

In Formula (13), $R^{16}$ may be substituted or unsubstituted $C_{1-100}$ or $C_{1-20}$ alkyl, typically $C_{1-12}$ alkyl; substituted or unsubstituted $C_{3-30}$ or $C_{3-20}$ cycloalkyl; substituted or unsubstituted poly($C_{1-3}$ alkylene oxide); or a monocyclic, polycyclic, or fused polycyclic $C_{4-20}$ lactone-containing group. The substituted $C_{1-100}$ or $C_{1-20}$ alkyl, the substituted $C_{3-30}$ or $C_{3-20}$ cycloalkyl, and the substituted poly($C_{1-3}$ alkylene oxide) are substituted with one or more of a sulfonamide group (e.g., —$NHSO_2CF_3$), a hydroxy group (—OH), or a fluoroalcohol group (e.g., —$C(CF_3)_2OH$).

In Formula (14), $Ar^1$ may be a substituted $C_{5-60}$ aromatic group that optionally includes one or more aromatic ring heteroatoms chosen from N, O, S, or a combination thereof, wherein the aromatic group may be monocyclic, non-fused polycyclic, or fused polycyclic. When the $C_{5-60}$ aromatic group is polycyclic, the ring or ring groups may be fused (such as naphthyl or the like), non-fused, or a combination thereof. When the polycyclic $C_{5-60}$ aromatic group is non-fused, the ring or ring groups may be directly linked (such as biaryls, biphenyl, or the like) or may be bridged by a heteroatom (such as triphenylamino or diphenylene ether). In some aspects, the polycyclic $C_{5-60}$ aromatic group may include a combination of fused rings and directly linked rings (such as binaphthyl or the like).

In Formula (14), y may be an integer from 1 to 12, preferably from 1 to 6, and typically from 1 to 3. Each $R^x$ may independently be hydrogen or methyl, provided that at least one $R^x$ is hydrogen. Non-limiting examples of the second repeating unit of the polymer may include:

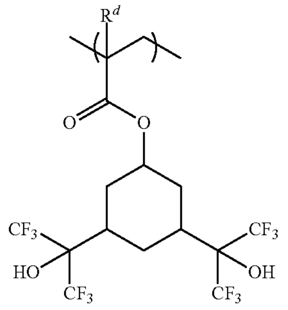

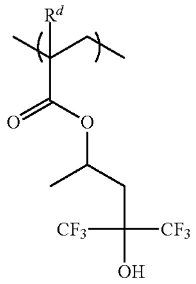

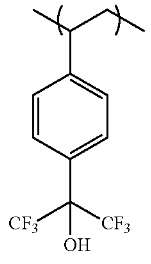

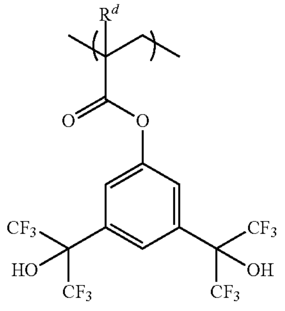

-continued
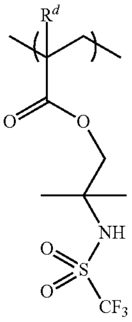
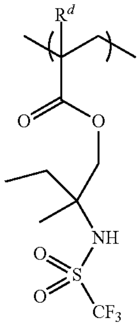
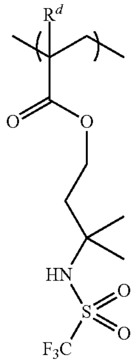
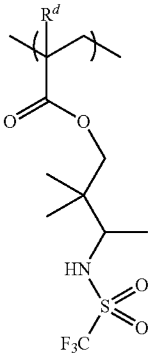
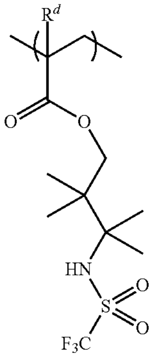
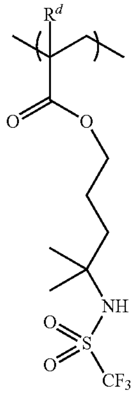
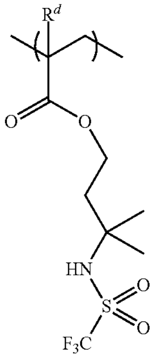
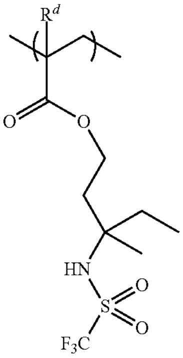
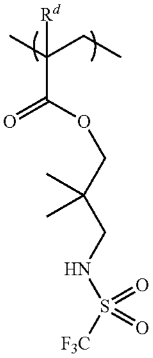
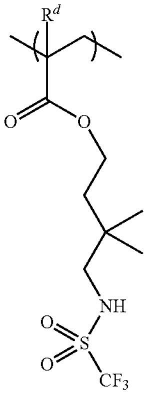
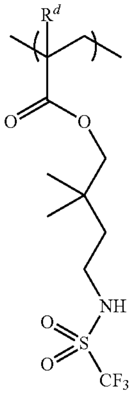
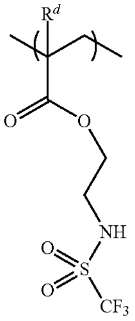
-continued
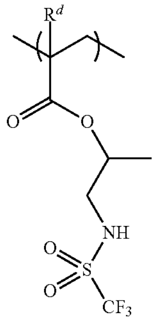
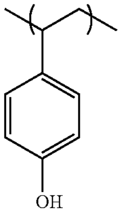
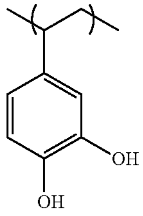
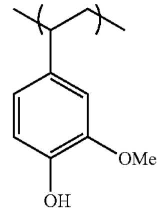
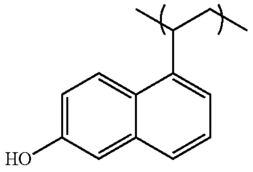
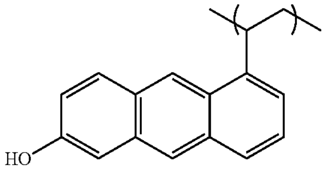
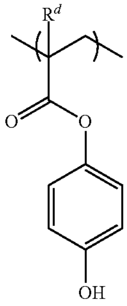
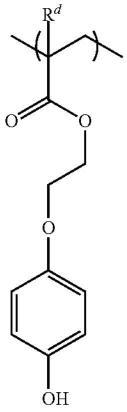
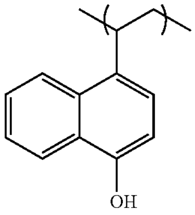
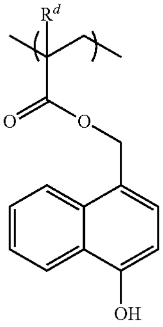
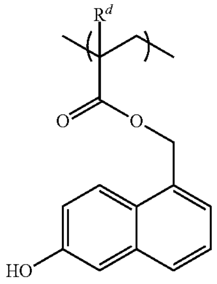
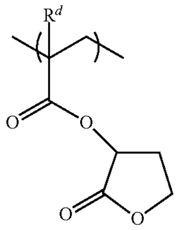
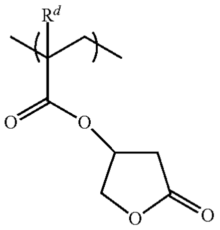

-continued

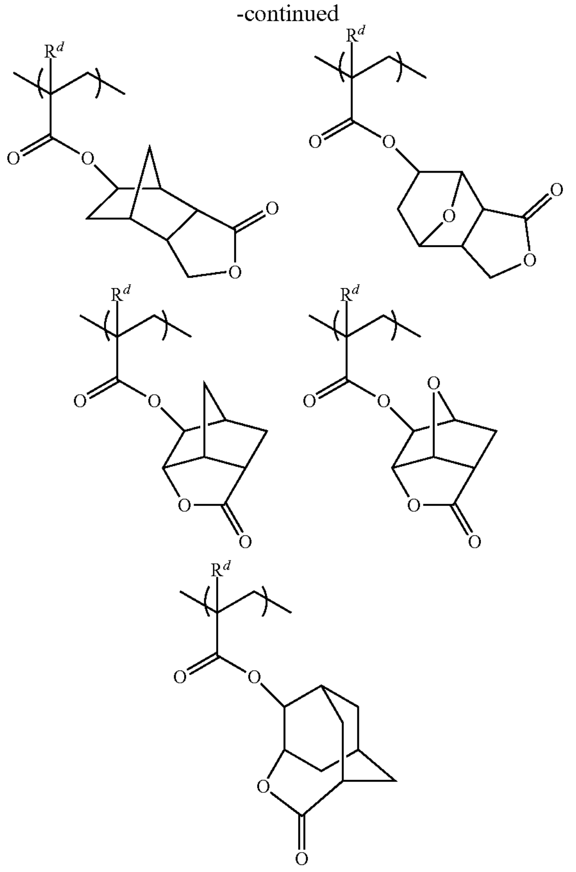

wherein $R^d$ may be hydrogen, fluorine, cyano, or substituted or unsubstituted $C_{1-10}$ alkyl. Preferably, $R^d$ may be hydrogen, fluorine, or substituted or unsubstituted $C_{1-5}$ alkyl, typically methyl.

The second repeating unit, if present, is typically incorporated in the polymer in an amount from 20 to 80 mole percent (mol %), more typically from 25 to 75 mol %, and still more typically from 30 to 70 mol %, based on total repeating units of the polymer.

It is to be understood that the first repeating unit and the second repeating unit are structurally different in the polymer.

In an embodiment, the polymer may further include a third repeating unit, wherein the third repeating unit is different from the first repeating unit and the second repeating unit.

In one or more aspects, the third repeating unit may include a hydroxyaryl group, a sulfonamide group, a fluoroalcohol group, or a combination thereof.

When present, the polymer typically includes the third repeating unit in an amount from 10 to 60 mol %, typically from 10 to 50 mol %, more typically from 10 to 40 mol %, based on total repeating units of the polymer.

In some aspects, the polymer may further optionally include one or more additional repeating units. The additional repeating units may be, for example, one or more additional units for purposes of adjusting properties of the photoresist composition. Exemplary additional units may include those derived from one or more of (meth)acrylate, vinyl aromatic, vinyl ether, vinyl ketone, and/or vinyl ester monomers. The one or more additional repeating units, if present in the polymer, may be used in an amount of up to 90 mol %, typically from 3 to 50 mol %, based on total repeating units of the polymer. Non-limiting exemplary polymers of the present invention may include the following:

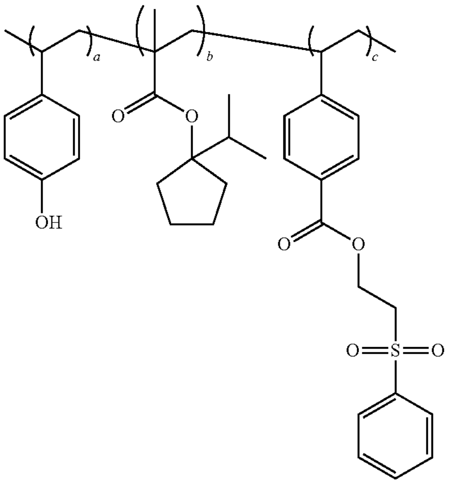

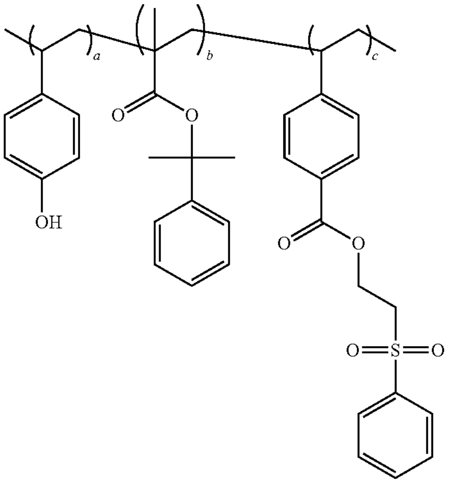

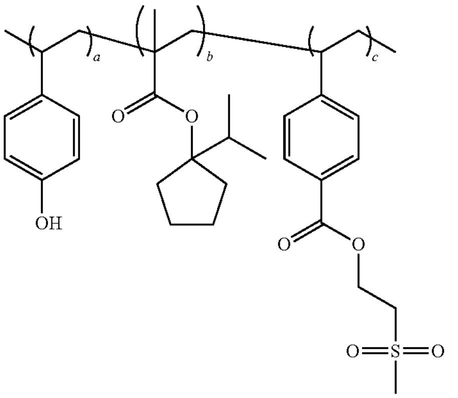

-continued

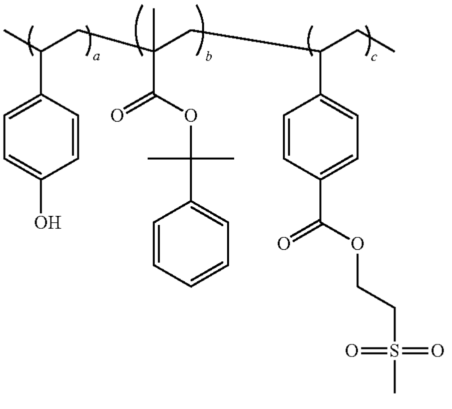

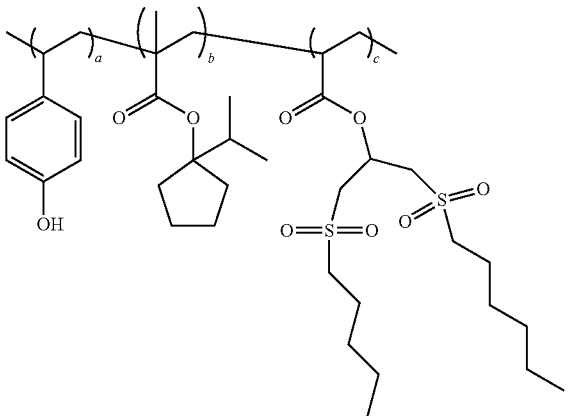

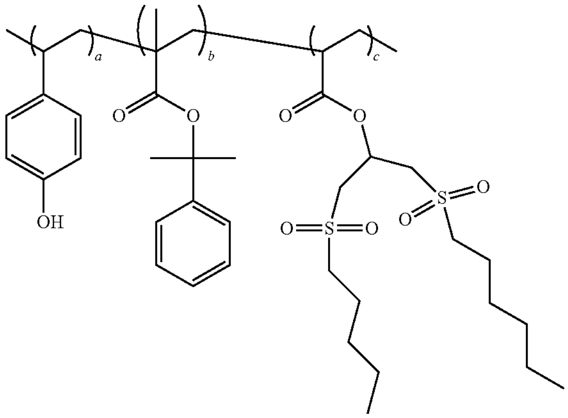

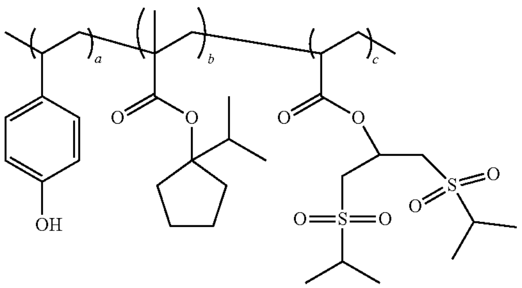

-continued

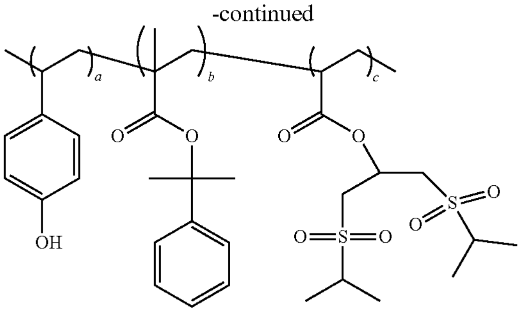

wherein a, b, and c, each represent the mol % of the repeating unit based on 100 mol % of total repeating units in the polymer.

The polymer typically has a weight average molecular weight ($M_w$) from 1,000 to 50,000 Dalton (Da), preferably from 2,000 to 30,000 Da, more preferably 2,500 to 20,000 Da, and still more preferably from 3,500 to 15,000 Da. The PDI of the polymer is typically from 1.1 to 3, and more typically from 1.1 to 2. Molecular weights are determined by gel permeation chromatography (GPC) using polystyrene standards.

The polymer may be prepared using any suitable method(s) in the art. For example, one or more monomers corresponding to the repeating units described herein may be combined, or fed separately, using suitable solvent(s) and initiator, and polymerized in a reactor. For example, the polymer may be obtained by polymerization of the respective monomers under any suitable conditions, such as by heating at an effective temperature, irradiation with actinic radiation at an effective wavelength, or a combination thereof.

Also provided is a photoresist composition including the polymer as described herein and a solvent. For example, the photoresist composition may include a first polymer that is a polymer as described herein, and may further include a second (different) polymer that is structurally different from the first polymer.

The second polymer includes one or more repeating units as described herein, for example, such as those derived from one or more of (meth)acrylate, vinyl aromatic, vinyl ether, vinyl ketone, and/or vinyl ester monomers. For example, the second polymer may include a repeating unit that includes an acid labile group, a hydroxyaryl group, a fluoroalcohol group, a sulfonamide group, a lactone group, or a combination thereof.

The second polymer typically has a $M_w$ from 1,000 to 50,000 Da, specifically from 2,000 to 30,000 Da, more specifically from 3,000 to 20,000 Da, still more specifically from 3,000 to 10,000 Da. The PDI of the polymer, which is the ratio of $M_w$ to $M_n$ is typically from 1.1 to 3, and specifically from 1.1 to 2. Molecular weights are determined by GPC using polystyrene standards.

The second polymer may be prepared using any suitable methods in the art. For example, one or more monomers corresponding to the repeating units described herein may be combined, or fed separately, using suitable solvent(s) and initiator, and polymerized in a reactor. For example, the second polymer may be obtained by polymerization of the respective monomers under any suitable conditions, such as by heating at an effective temperature, irradiation with actinic radiation at an effective wavelength, or a combination thereof.

When the photoresist composition includes both the first polymer and the second polymer, they may be included at a weight ratio from 1:4 to 4:1, for example, from 1:4 to 4:1, or from 1:3 to 3:1, or from 1:2 to 2:1.

The photoresist composition includes a solvent for dissolving the components of the composition and facilitating its coating on a substrate. Preferably, the solvent is an organic solvent conventionally used in the manufacture of electronic devices. Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane; alcohols such as methanol, ethanol, 1-propanol, iso-propanol, tert-butanol, 2-methyl-2-butanol and 4-methyl-2-pentanol; propylene glycol monomethyl ether (PGME), ethers such as diethyl ether, tetrahydrofuran, 1,4-dioxane and anisole; ketones such as acetone, methyl ethyl ketone, methyl iso-butyl ketone, 2-heptanone and cyclohexanone (CHO); esters such as ethyl acetate, n-butyl acetate, propylene glycol monomethyl ether acetate (PGMEA), ethyl lactate (EL), hydroxyisobutyrate methyl ester (HBM) and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof. The total solvent content (i.e., cumulative solvent content for all solvents) in the photoresist composition is typically from 40 to 99 weight percent (wt %), more typically from 70 to 99 wt %, and still more typically from 85 to 99 wt %, based on total weight of the photoresist composition. The desired solvent content will depend, for example, on the desired thickness of the coated photoresist layer and coating conditions.

In the photoresist compositions, the polymer is typically present in the photoresist composition in an amount from 10 to 99.9 wt %, typically from 25 to 99 wt %, and more typically from 50 to 95 wt %, based on total solids of the photoresist composition. It will be understood that total solids includes the polymer, PAGs, and other non-solvent components.

The photoresist composition may further include a photoacid generator (PAG). The PAG may be in ionic or non-ionic form. The PAG may be in polymeric or non-polymeric form. In polymeric form, the PAG may be present as a moiety in a repeating unit of a polymer that is derived from a polymerizable PAG monomer.

Suitable PAG compounds maybe of the formula $G^+A^-$, wherein $G^+$ is a photoactive cation and $A^-$ is an anion that can generate a photoacid. The photoactive cation is preferably chosen from onium cations, preferably iodonium or sulfonium cations. Particularly suitable anions include those whose conjugated acids have a pKa of from −15 to 10. The anion is typically an organic anion having a sulfonate group or a non-sulfonate-type group, such as sulfonamidate, sulfonimidate, methide, or borate.

In some embodiments, the photoactive cation may be a sulfonium cation or an iodonium cation. For example, the photoactive cation may be a sulfonium cation of Formula (15) or an iodonium cation of Formula (16):

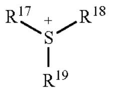
(15)

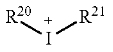
(16)

In Formulae (15) and (16), $R^{17}$ to $R^{21}$ may each independently be substituted or unsubstituted $C_{1-20}$ alkyl, substituted or unsubstituted $C_{3-20}$ cycloalkyl, substituted or unsubstituted $C_{2-20}$ alkenyl, substituted or unsubstituted $C_{6-30}$ aryl, substituted or unsubstituted $C_{6-30}$ iodoaryl, substituted or unsubstituted $C_{3-30}$ heteroaryl, substituted or unsubstituted $C_{7-20}$ arylalkyl, or substituted or unsubstituted $C_{4-20}$ heteroarylalkyl, or combinations thereof. Each of $R^{17}$ to $R^{19}$ may be either separate or connected to another group of $R^{17}$ to $R^{19}$ via a single bond or a divalent linking group to form a ring. $R^{20}$ and $R^{21}$ may be either separate or connected to each other via a single bond or a divalent linking group to form a ring. Each of $R^{17}$ to $R^{21}$ optionally may include as part of its structure a divalent linking group. Each of $R^{17}$ to $R^{21}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups. Exemplary sulfonium cations of Formula (15) may include one or more of the following:

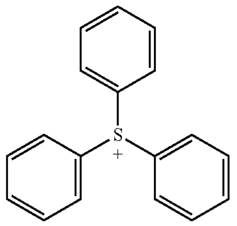

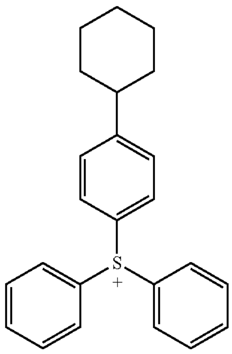

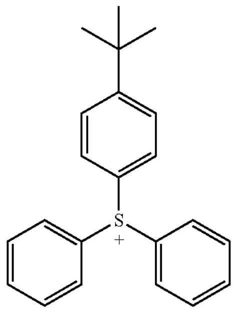

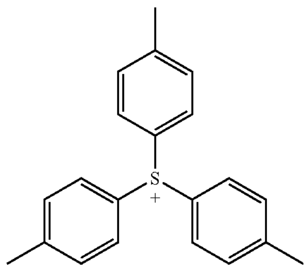

-continued
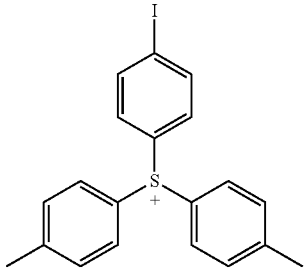
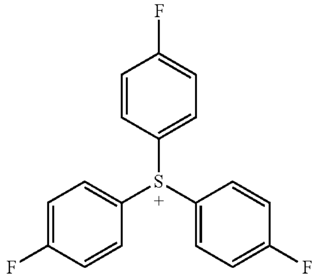
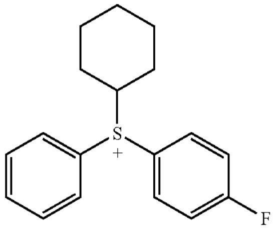
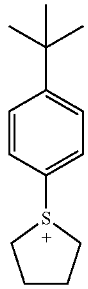
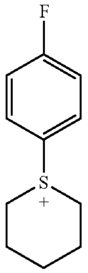
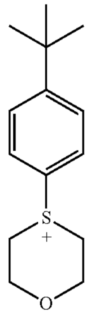
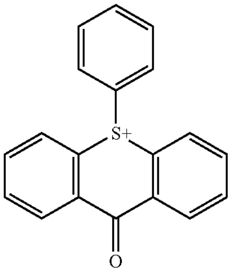
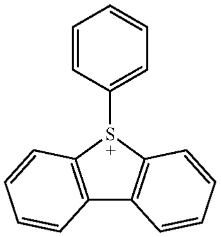
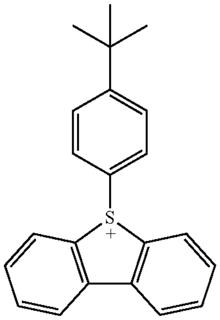
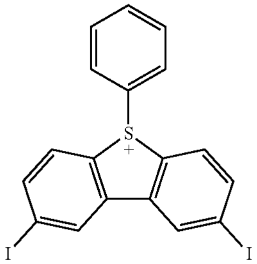
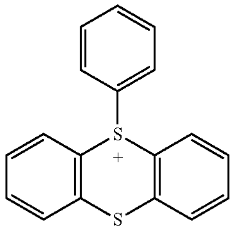
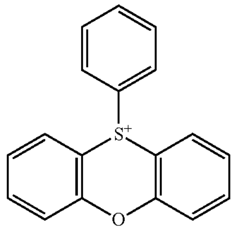
-continued
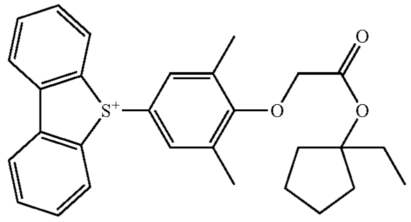
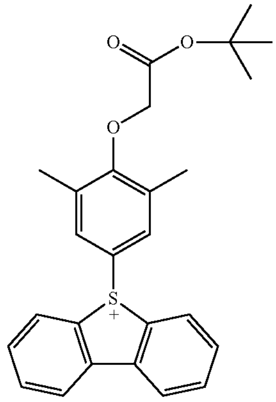
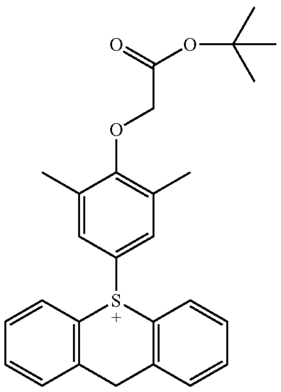
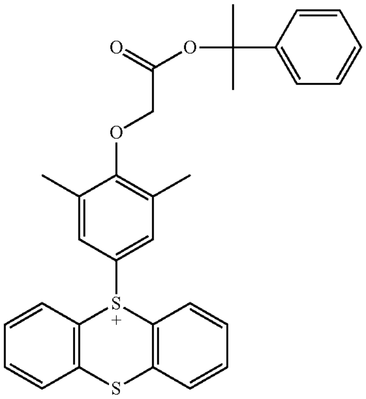
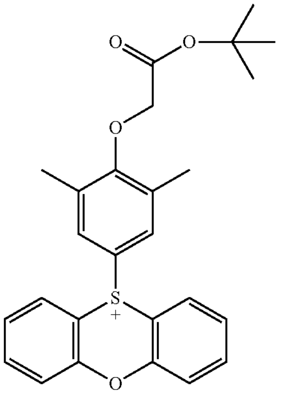
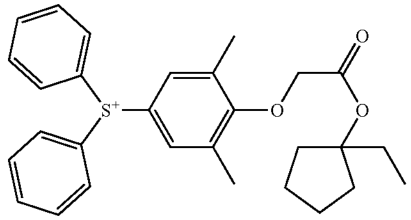

-continued
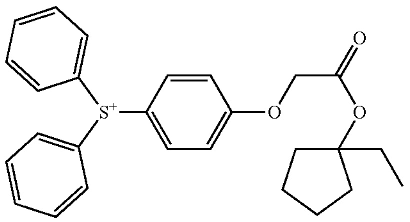
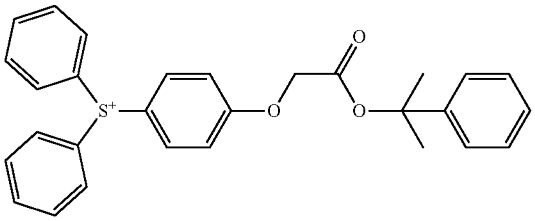
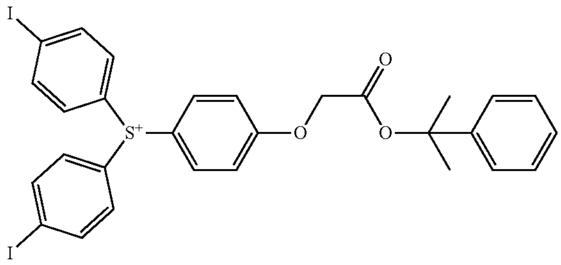
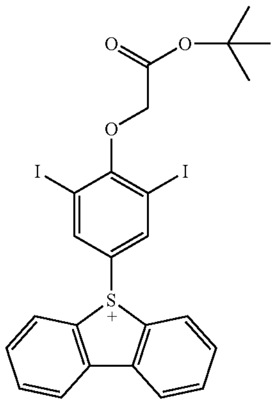
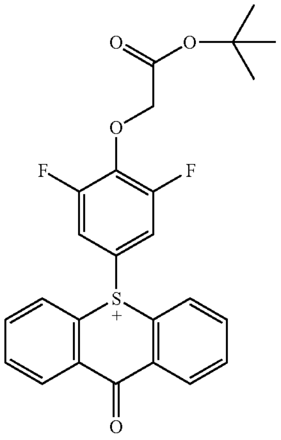
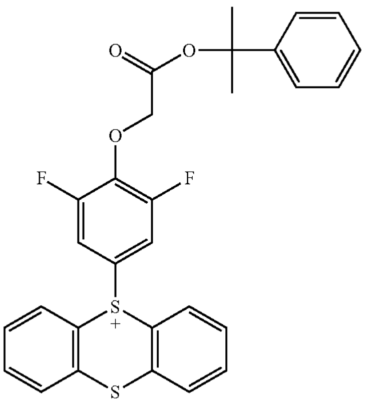
-continued
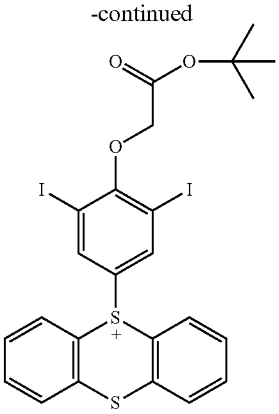
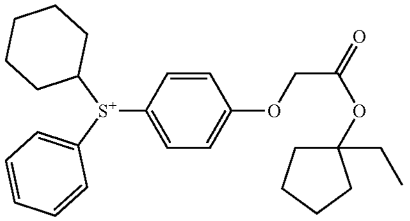
Exemplary iodonium cations of Formula (16) may include one or more of the following:
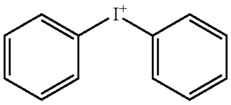
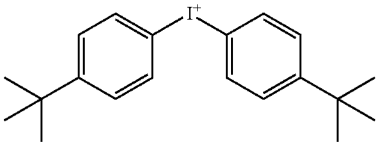
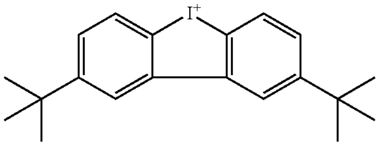
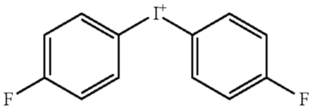
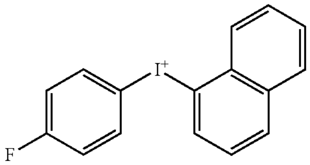
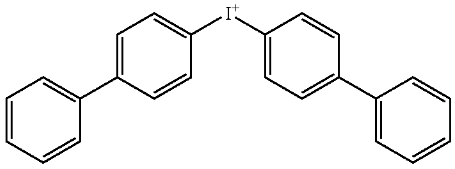
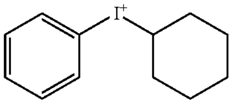
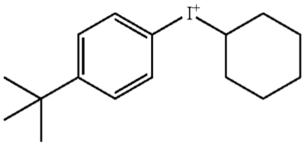

-continued
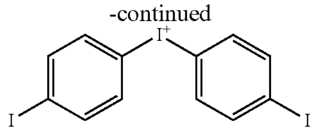
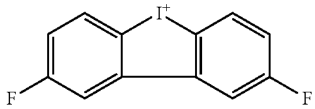
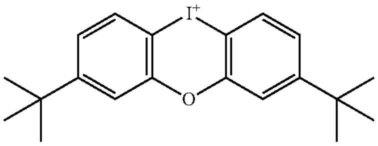
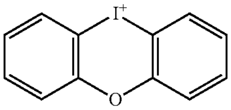
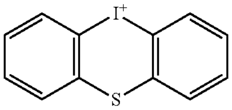
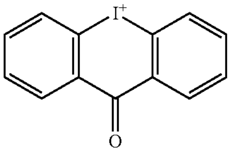
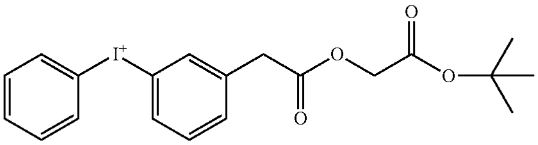
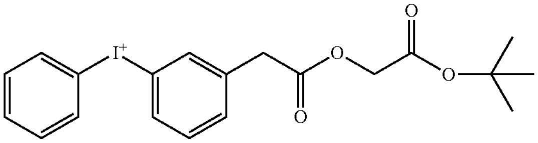
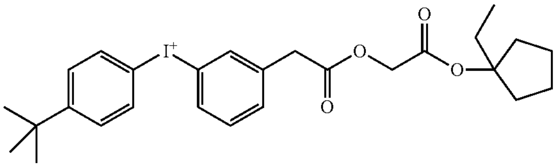
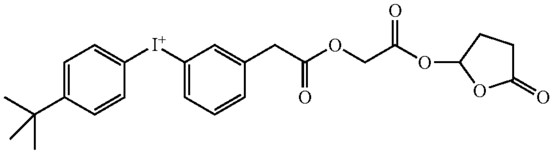
Exemplary organic anions having a sulfonate group may include one or more of the following:
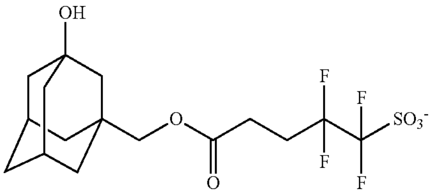
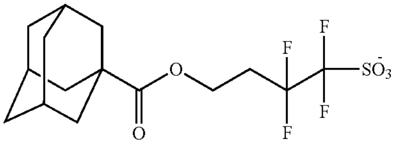
-continued
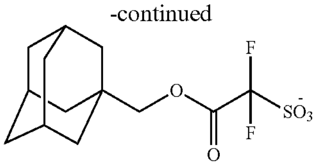
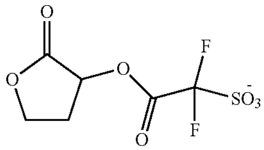
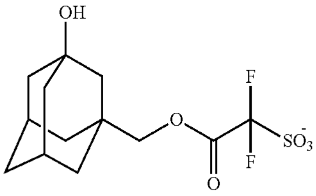
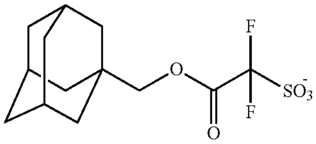
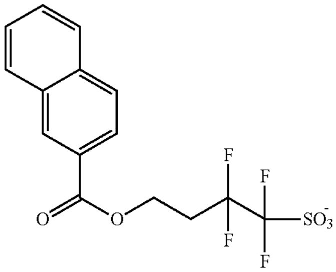
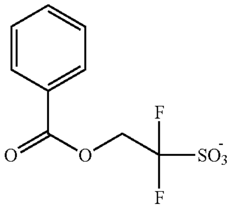
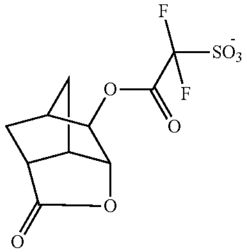
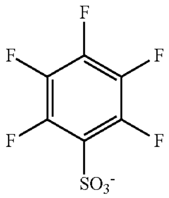
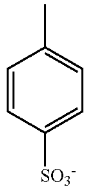
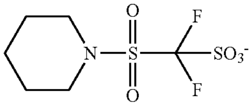
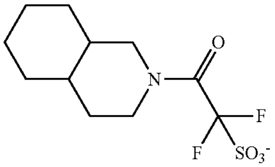

-continued
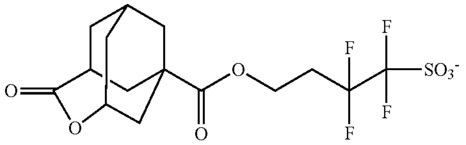
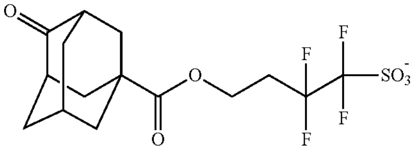
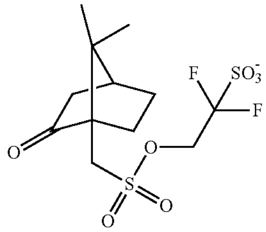
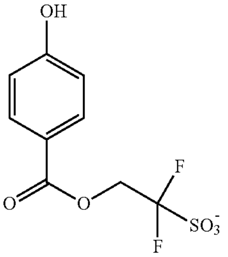
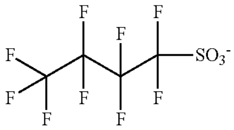
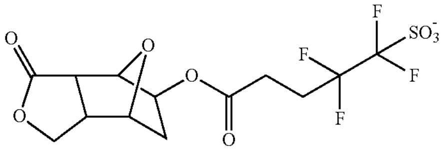
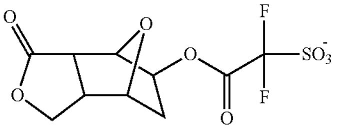
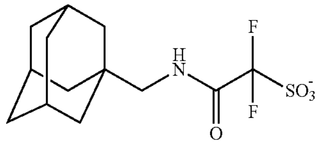
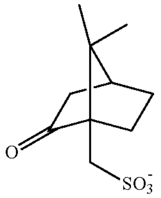
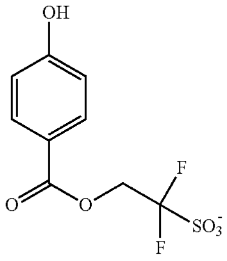
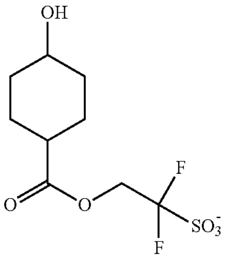
-continued
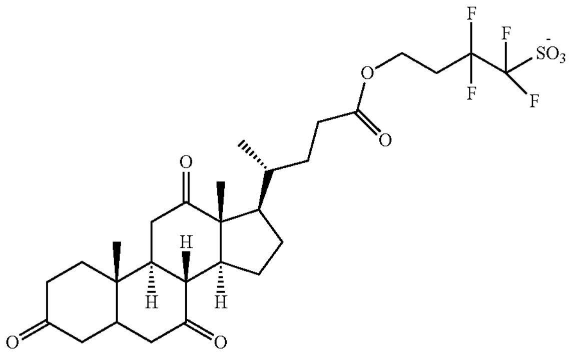
Exemplary non-sulfonated anions may include one or more of the following:
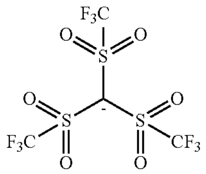
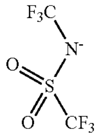
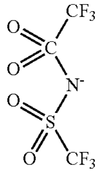
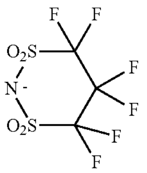
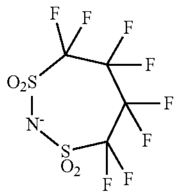
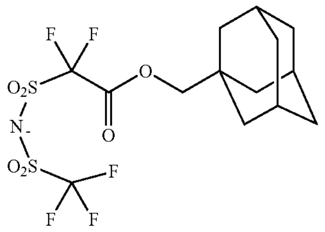
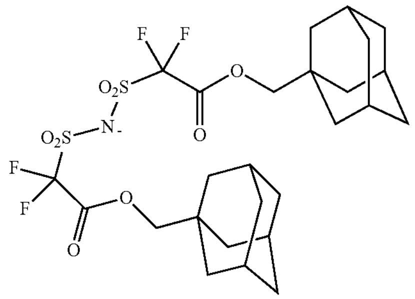
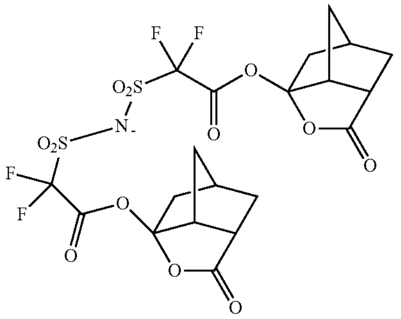

-continued

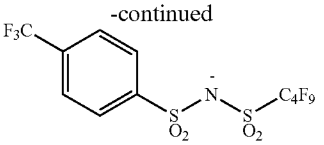

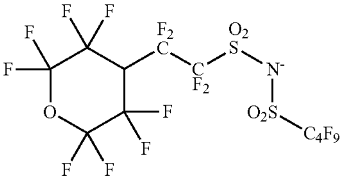

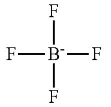

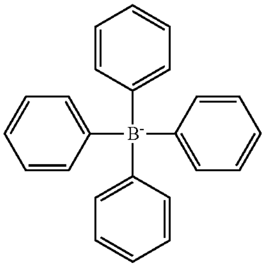

Commonly used onium salts may include, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Other useful PAG compounds are known in the art of chemically amplified photoresists and include, for example: non-ionic sulfonyl compounds, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable photoacid generators are further described in U.S. Pat. Nos. 8,431,325 and 4,189,323.

In some aspect, the first polymer optionally may further comprise a repeating unit comprising a PAG moiety, for example a repeating unit derived from one or more monomers of Formula (8):

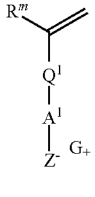

(8)

In Formula (8), $R'''$ may be hydrogen, tluonne, cyano, or substituted or unsubstituted $C_{1-10}$ alkyl. Preferably, $R'''$ is hydrogen, fluorine, or substituted or unsubstituted $C_{1-5}$ alkyl, typically methyl. $Q^1$ may be a single bond or a divalent linking group. Preferably, $Q^1$ may include 1 to 10 carbon atoms and at least one heteroatom, more preferably —C(O)—O—.

In Formula (8), $A^1$ may be one or more of substituted or unsubstituted $C_{1-30}$ alkylene, substituted or unsubstituted $C_{3-30}$ cycloalkylene, substituted or unsubstituted $C_{2-30}$ heterocycloalkylene, substituted or unsubstituted $C_{6-30}$ arylene, or substituted or unsubstituted $C_{3-30}$ heteroarylene. Preferably, $A^1$ may be a divalent $C_{1-30}$ perfluoroalkylene group that is optionally substituted.

In Formula (8), $Z^-$ is an anionic moiety, the conjugated acid of which typically has a pKa from −15 to 1. $Z^-$ may be a sulfonate, a carboxylate, an anion of a sulfonamide, an anion of a sulfonimide, or a methide anion. Particularly preferred anion moieties are fluorinated alkyl sulfonates and fluorinated sulfonimides.

In Formula (8), $G^+$ is an organic cation as defined above. In some embodiments, $G^+$ is an iodonium cation substituted with two alkyl groups, two aryl groups, or a combination of alkyl and aryl groups; or a sulfonium cation substituted with three alkyl groups, three aryl groups, or a combination of alkyl and aryl groups.

Exemplary monomers of Formula (8) include the following:

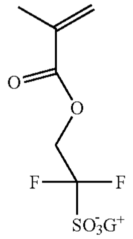

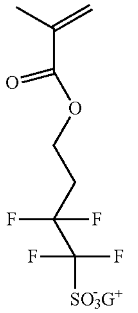

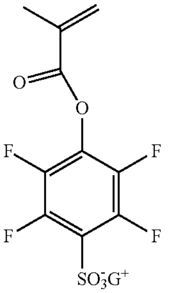

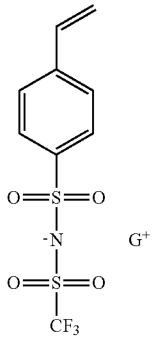

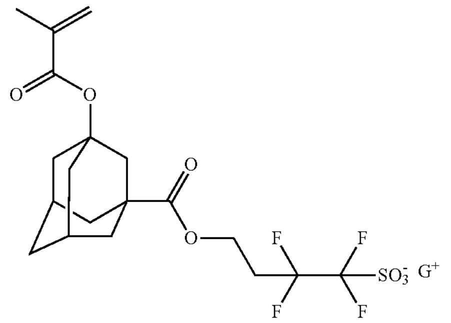

-continued

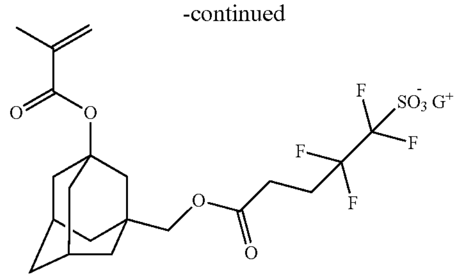

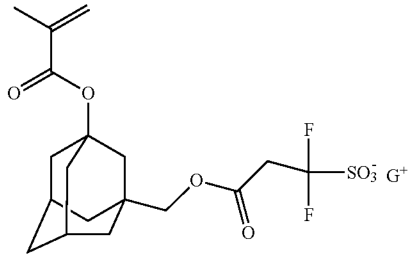

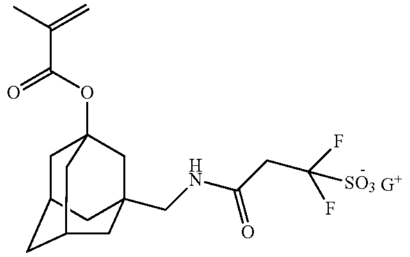

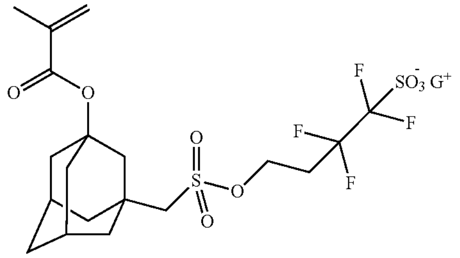

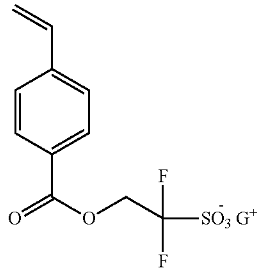

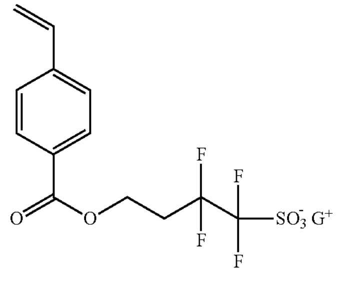

wherein $G^+$ is the organic cation.

The polymer may include a repeating unit comprising a PAG moiety in an amount from 1 to 15 mol %, typically from 1 to 8 mol %, more typically from 2 to 6 mol %, based on total repeating units in the polymer.

Typically, when the photoresist composition includes a non-polymeric PAG, the PAG is present in the photoresist composition in an amount of from 0.1 to 55 wt %, more typically 1 to 25 wt %, based on total solids of the photoresist composition. When present in polymeric form, the PAG is typically included in a polymer in an amount from 1 to 25 mol %, more typically from 1 to 8 mol %, or from 2 to 6 mol %, based on total repeating units in the polymer.

In some aspects, the anion and/or cation of the PAG does not include and is free of —F, —$CF_3$, or —$CF_2$— groups. It should be understood that "free of —F, —$CF_3$, or —$CF_2$— groups" means that the anion and/or cation of the PAG excludes groups such as —$CH_2CF_3$ and —$CH_2CF_2CH_3$. In still other aspects, the anion and/or the cation of the PAG is free of fluorine (i.e., does not contain a fluorine atom and is not substituted by a fluorine-containing group). In some aspects, the photoacid generator is free of fluorine (i.e., both the photoactive cation and the anion are free of fluorine).

In some aspects, the photoresist composition may further include a material that comprises one or more base-labile groups (a "base-labile material"). As referred to herein, base-labile groups are functional groups that can undergo cleavage reaction to provide polar groups such as hydroxyl, carboxylic acid, sulfonic acid, and the like, in the presence of an aqueous alkaline developer after exposure and post-exposure baking steps. The base-labile group will not react significantly (e.g., will not undergo a bond-breaking reaction) prior to a development step of the photoresist composition that comprises the base-labile group. Thus, for instance, a base-labile group will be substantially inert during pre-exposure soft-bake, exposure, and post-exposure bake steps. By "substantially inert" it is meant that ≤5%, typically ≤1%, of the base-labile groups (or moieties) will decompose, cleave, or react during the pre-exposure soft-bake, exposure, and post-exposure bake steps. The base-labile group is reactive under typical photoresist development conditions using, for example, an aqueous alkaline photoresist developer such as a 0.26 normal (N) aqueous solution of tetramethylammonium hydroxide (TMAH). For example, a 0.26 N aqueous solution of TMAH may be used for single puddle development or dynamic development, e.g., where the 0.26 N TMAH developer is dispensed onto an imaged photoresist layer for a suitable time such as 10 to 120 seconds (s). An exemplary base-labile group is an ester group, typically a fluorinated ester group. Preferably, the base-labile material is substantially not miscible with and has a lower surface energy than the polymer and other solid components of the photoresist composition. When coated on a substrate, the base-labile material can thereby segregate from other solid components of the photoresist composition to a top surface of the formed photoresist layer.

In some aspects, the base-labile material may be a polymeric material, also referred to herein as a base-labile polymer, which may include one or more repeating units comprising one or more base-labile groups. For example, the base-labile polymer may comprise a repeating unit comprising two or more base-labile groups that are the same or different. A preferred base-labile polymer includes at least one repeating unit comprising two or more base-labile groups, for example a repeating unit comprising two or three base-labile groups.

The base-labile polymer may be prepared using any suitable methods in the art. For example, the base-labile polymer may be obtained by polymerization of the respective monomers under any suitable conditions, such as by heating at an effective temperature, irradiation with actinic radiation at an effective wavelength, or a combination thereof. Additionally, or alternatively, one or more base-labile groups may be grafted onto the backbone of a polymer using suitable methods.

In some aspects, the base-labile material is a single molecule comprising one more base-labile ester groups, preferably one or more fluorinated ester groups. The base-labile materials that are single molecules typically have a molecular weight in the range from 50 to 1,500 Da.

When present, the base-labile material is typically present in the photoresist compositions in an amount of from 0.01 to 10 wt %, typically from 1 to 5 wt %, based on total solids of the photoresist composition.

Additionally, or alternatively, to the base-labile polymer, the photoresist compositions may further include one or more polymers in addition to and different from the polymer as described above. For example, the photoresist compositions may include an additional polymer or polymer as described above but different in composition. Additionally, or alternatively, the one or more additional polymers may include those well known in the photoresist art, for example, those chosen from polyacrylates, polyvinylethers, polyesters, polynorbornenes, polyacetals, polyethylene glycols, polyamides, polyacrylamides, polyphenols, novolacs, styrenic polymers, polyvinyl alcohols, or combinations thereof.

The photoresist composition may further include one or more additional, optional additives. For example, optional additives may include actinic and contrast dyes, anti-striation agents, plasticizers, speed enhancers, sensitizers, photo-decomposable quenchers (PDQ) (and, also known as photo-decomposable bases), basic quenchers, thermal acid generators, surfactants, and the like, or combinations thereof. If present, the optional additives are typically present in the photoresist compositions in an amount of from 0.01 to 10 wt %, based on total solids of the photoresist composition.

PDQs generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds, paired with an anion of a weak acid (pKa>1) such as, for example, an anion of a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary sulfonic acids include p-toluene sulfonic acid, camphor sulfonic acid and the like. In a preferred embodiment, the photo-decomposable quencher is a photo-decomposable organic zwitterion compound such as diphenyliodonium-2-carboxylate.

The PDQ may be in non-polymeric or polymer-bound form. The polymerized units containing the photo-decomposable quencher are typically present in an amount from 0.1 to 30 mol %, preferably from 1 to 10 mol % and more preferably from 1 to 2 mol %, based on total repeating units of the polymer.

Exemplary basic quenchers include, for example, linear aliphatic amines such as tributylamine, trioctylamine, triisopropanolamine, tetrakis(2-hydroxypropyl)ethylenediamine: n-tert-butyldiethanolamine, tris(2-acetoxy-ethyl)amine, 2,2',2",2"-(ethane-1,2-diylbis(azanetriyl))tetraethanol, 2-(dibutylamino)ethanol, and 2,2',2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl) morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; imines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

The basic quenchers may be in non-polymeric or polymer-bound form. When in polymeric form, the quencher may be present in repeating units of the polymer. The repeating units containing the quencher are typically present in an amount of from 0.1 to 30 mol %, preferably from 1 to 10 mol % and more preferably from 1 to 2 mol %, based on total repeating units of the polymer.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova. In an aspect, the photoresist composition further includes a surfactant polymer including a fluorine-containing repeating unit.

Also provided are methods of forming a pattern. According to an aspect, a method of forming a pattern includes applying a layer of a photoresist composition on a substrate to form a photoresist composition layer; pattern-wise exposing the photoresist composition layer to activating radiation to form an exposed photoresist composition layer; and developing the exposed photoresist composition layer. The photoresist composition includes the polymer as described herein and a solvent. In some embodiments, the polymer of the photoresist composition includes a first repeating unit derived from a first monomer represented by Formula (1). In some embodiments, the polymer of the photoresist composition includes a first repeating unit derived from a first monomer represented by Formula (1); and a second repeating unit including an acid labile group, a hydroxyaryl group, or a fluoroalcohol group. In still other embodiments, the polymer of the photoresist composition includes a first repeating unit derived from a first monomer represented by Formula (1); a second repeating unit including an acid labile group, a hydroxyaryl group, or a fluoroalcohol group; and a third repeating unit as provided herein.

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP™ 3000, AP™ 8000, and AP™ 9000S designations, available from DuPont Electronics & Industrial (Marlborough, Massachusetts).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, from 1,000 to 2,500 rpm, for a period from 15 to 120 seconds to obtain a layer of the photoresist composition on the substrate. It will be appreciated by those skilled in the art that the thickness of the coated layer may be adjusted by changing the spin speed and/or the total solids of the composition. A photoresist composition layer formed from the compositions of the invention typically has a dried layer thickness from 3 to 30 micrometers (μm), preferably from greater than 5 to 30 μm, and more preferably from 6 to 25 μm.

The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the photoresist composition and thickness. The soft bake temperature is typically from 80 to 170° C., and more typically from 90 to 150° C. The soft bake time is typically from 10 seconds to 20 minutes (mins.), more typically from 1 to 10 mins., and still more typically from 1 to 2 mins. The heating time can be readily determined by one of ordinary skill in the art based on the components of the composition.

The photoresist layer is next pattern-wise exposed to activating radiation to create a difference in solubility between exposed and unexposed regions. Reference herein to exposing a photoresist composition to radiation that is activating for the composition indicates that the radiation can form a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nanometer (nm), sub-300 nm or sub-200 nm, with 248 nm (KrF), 193 nm (ArF), 13.5 nm (EUV) wavelengths or e-beam lithography being preferred. Preferably, the activating radiation is 248 nm radiation. The methods find use in immersion or dry (non-immersion) lithography techniques. The exposure energy is typically from 1 to 200 millijoules per square centimeter ($mJ/cm^2$), preferably from 10 to 100 $mJ/cm^2$ and more preferably from 20 to 50 $mJ/cm^2$, dependent upon the exposure tool and components of the photoresist composition.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the photoresist composition and layer thickness. The PEB is typically conducted at a temperature from 70 to 150° C., preferably from 75 to 120° C., and a time from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as TMAH, preferably 0.26 N TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof; and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching. The photoresist pattern may, for example, be used for pattern transfer to an underlying hardmask layer which, in turn, is used as an etch mask for pattern transfer to one or more layers below the hardmask layer. If the photoresist pattern is not consumed during pattern transfer, it may be removed from the substrate by known techniques, for example, oxygen plasma ashing. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The invention is further illustrated by the following non-limiting examples.

EXAMPLES

Synthesis Examples

The synthetic reactions were performed under an anhydrous nitrogen atmosphere. All chemicals were used as received from commercial suppliers and without further purification. Proton nuclear magnetic resonance ($^1$H-NMR) spectra for all compounds were obtained either on a 499-megahertz (MHz) NMR spectrometer. The chemical shifts are reported in δ (parts per million, ppm) relative to an internal tetramethylsilane standard or deuterated peaks. Multiplicities are indicated by singlet (s), doublet (d), triplet (t), multiplet (m), doublet of doublets (dd), doublet of triplets (dt), triplet of triplets (tt), or broad singlet (br).

Synthesis of Monomer MS1

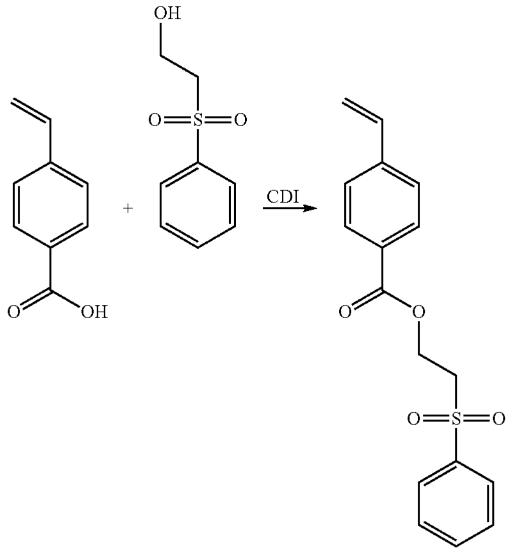

MS1

1,1'-carbonyldiimidazole (CDI) (8.75 grams (g), 54.0 millimoles (mmol)) was added portion wise to a solution of 4-vinylbenzoic acid (8.0 g, 54.0 mmol) in tetrahydrofuran (THF, 100 mL). The resulting reaction mixture was stirred at room temperature for 15 minutes. The reaction mixture temperature was then increased to 60° C. and 2-(phenylsulfonypethan-1-ol (10.0 g, 53.70 mmol) was added thereto, and the resulting mixture was stirred and heated at 60° C. for 16 hours. The reaction mixture was then allowed to cool to room temperature. The solvent was removed under a reduced pressure to produce a crude product as an oily residue. The crude product was dissolved in dichloromethane (150 mL) and the solution was washed twice with aqueous ammonium chloride (30 mL, saturated solution) and then washed twice with deionized (DI) water (30 mL). The organic phase was separated, and the solvent was removed under a reduced pressure to provide MS1 as a white solid. Yield: 12.8 g (75.3%). $^1$H NMR (δ, acetone-$d_6$): 8.02 ppm (d, 2H, 3ArH), 7.73 ppm (m, 3H, 3ArH), 7.63 ppm (m, 2H, 2ArH), 7.53 ppm (d, 2H, 2ArH), 6.84 ppm (m, 1H, $CH{=}CH_2$), 5.92 ppm (d, 1H, $CH{=}CH_2$), 5.43 ppm (d, 1H, $CH{=}CH_2$), 4.68 ppm (t, 2H, $CH_2O$), and 3.83 ppm (t, 2H, $CH_2SO_2$).

Synthesis of Monomer MS2

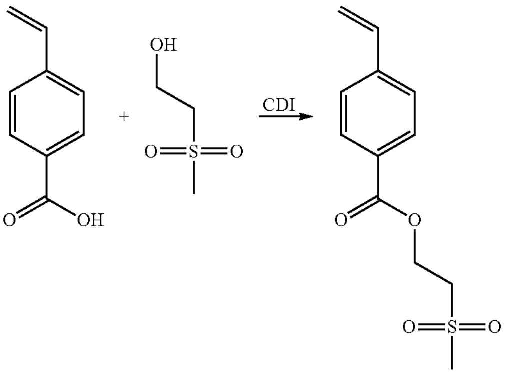

MS2

1,1'-carbonyldiimidazole (CDI) (11.0 g, 67.8 mmol) was added portion wise to a solution of 4-vinylbenzoic acid (10.0 g, 67.5 mmol) in THF (100 mL). The resulting mixture was stirred at room temperature for 15 minutes. The reaction mixture temperature was then increased to 60° C. and 2-(methylsulfonypethan-1-ol (8.4 g, 69.13 mmol) was added thereto, and the resulting mixture was stirred and heated at 60° C. for 16 hours. The reaction mixture was then allowed to cool to room temperature. The solvent was removed under a reduced pressure to produce a crude product as an oily residue. The crude product was dissolved dichloromethane (150 mL) and the solution was washed twice with aqueous ammonium chloride (30 mL, saturated solution) and then washed twice with deionized (DI) water (30 mL). The organic phase was separated, and the solvent was removed under a reduced pressure to provide MS2 as a white solid. Yield: 15.85 g (92.3%). $^1$H NMR (δ, acetone-$d_6$): 8.03 ppm (d, 2H, 3ArH), 7.62 ppm (d, 2H, 2ArH), 6.84 ppm (m, 1H, $CH{=}CH_2$), 5.99 ppm (d, 1H, $CH{=}CH_2$), 5.44 ppm (d, 1H, $CH{=}CH_2$), 4.76 ppm (t, 2H, $CH_2O$), 3.65 ppm (t, 2H, $CH_2SO_2$), and 3.1 ppm (s, 3h $SO_2CH_3$).

Synthesis of Monomer MS3

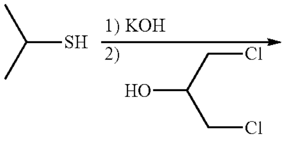

-continued

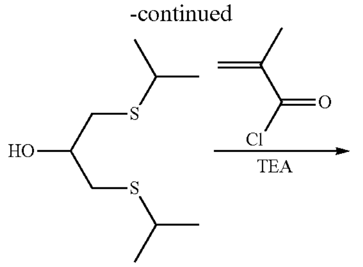

MS3-i

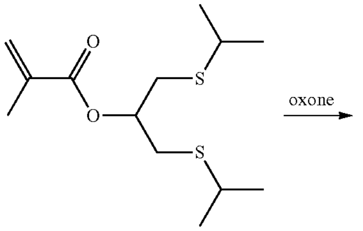

MS3-ii

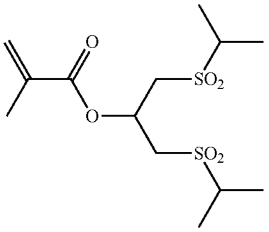

MS3

2-propanethiol (12.5 mL, 134.6 mmol) was slowly added to a solution of potassium hydroxide (8.36 g, 149.3 mmol) in methanol (150 mL). After reacting for 30 minutes, 1,3-dichloropropan-2-ol (7.53 g, 58.4 mmol) was added dropwise thereto, and the reaction mixture was stirred for 16 hours at room temperature. The intermediate product MS3-i was isolated by extraction using methyl t-butyl ether from water, followed by washing with a dilute solution of aqueous potassium hydroxide and then with a brine solution. The resulting intermediate product was dried under vacuum to yield a clear oil. Yield: 11.71 g (96%).

Intermediate product MS3-i (11.1 g, 53.3 mmol) and triethylamine (TEA, 20 mL, 143.5 mmol) were combined with 150 mL of methyl t-butyl ether to provide a solution. Methacryloyl chloride (7 mL, 71.7 mmol) was added dropwise thereto at room temperature and with constant stirring, and then the reaction mixture was allowed to stir for an additional4 hours. Intermediate product MS3-ii was isolated by extraction using methyl t-butyl ether and water. The resulting product was washed twice with a dilute aqueous hydrochloric acid solution, washed once with a dilute aqueous potassium hydroxide solution, and then washed once with an aqueous brine solution. The product obtained was dried under a reduced pressure to yield intermediate product MS3-ii as a clear oil. Yield: 11.60 g (79%).

Intermediate product MS3-ii (11.23 g, 40.6 mmol) was dissolved in a mixture of methanol (250 mL) and DI water (250 mL). Oxone (60 g, 97.5 mmol) was added thereto in a total of five portions, and the resulting reaction mixture was stirred at room temperature for an additional hour. A crude product was isolated by extraction using methyl t-butyl ether and water. The product was further purified by crystallization from a minimum volume of heptane to provide MS3 as a wax-like solid. Yield: 5.37 g (39%). $^1$H-NMR (δ, acetone-$d_6$): 6.18 ppm (d, 1H, CH═CHH), 5.83 ppm (tt, 1H, OCH), 5.72 ppm (p, 1H, CH═CHH), 3.73 ppm (qd, 4H, $SO_2CH_2$), 3.32 ppm (p, 2H, $SO_2CH$), 1.95 ppm (s, 3H, $CCH_3$), and 1.37 ppm (dd, 12H, $CHCH_3$).

Synthesis of Monomer MS4

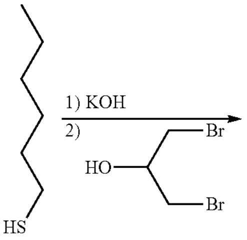

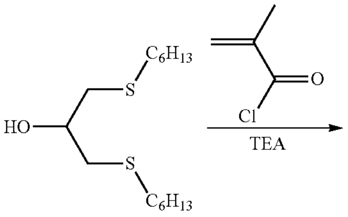

MS4-i

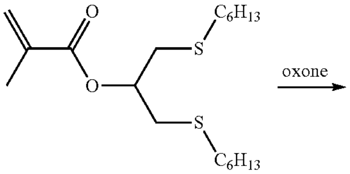

MS4-ii

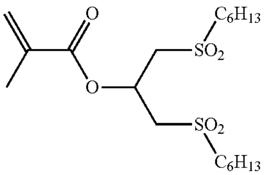

MS4

1-hexanethiol (21 mL, 148.8 mmol) was slowly added to a solution of potassium hydroxide (8.42 g, 150.1 mmol) in methanol (200 mL). The contents were stirred for 30 minutes at room temperature, and then 1,3-dibromopropan-2-ol (14.39 g, 65.6 mmol) was added thereto via a dropwise addition. The resulting reaction mixture was stirred at room temperature for an additional 15 hours. The intermediate product MS4-i was isolated by extraction using methyl t-butyl ether and water, followed by washing with a dilute solution of aqueous potassium hydroxide and then with a brine solution. The resulting product was dried under a reduced pressure to yield a clear oil. Yield: 19.60 g, with residual hexyl disulfide from starting material.

Intermediate product MS4-i (9.61 g, 32.8 mmol) and TEA (12 mL, 86.1 mmol) were combined with methyl t-butyl ether (120 mL) to provide a solution. Methacryloyl chloride (5 mL, 51.2 mmol) was added dropwise thereto at room temperature and with constant stirring. The reaction mixture was allowed to continue stirring at room temperature for an additional 4 hours. Intermediate product MS4-ii was isolated by extraction using methyl t-butyl ether and water. The resulting product was washed twice with a dilute aqueous hydrochloric acid solution, washed once with a dilute aqueous potassium hydroxide solution, and then washed once with an aqueous brine solution. The product obtained was dried under a reduced pressure to yield intermediate product MS4-ii as a clear oil. Yield: 12.07 g, with residual hexyl disulfide, and methacrylic acid anhydride. The impurities were carried over and did not affect the following step.

Intermediate product MS4-ii (5.83 g, 16.2 mmol) was dissolved in a mixture of methanol (200 mL) and water (100 mL). Oxone (35.2 g, 57.2 mmol) was added thereto in a total of five portions, and the resulting reaction mixture was stirred at room temperature for an additional hour. A crude product was isolated by extraction using methyl t-butyl ether and water. The product was further purified by crystallization from a minimum volume of heptane to provide MS4 as a wax-like solid. Yield: 4.29 g (62%). $^{1}$H-NMR (δ, chloroform-$d_1$): 6.24 ppm (s, 1H, CH═CHH), 5.72 ppm (m, 2H, CH═CHH and OCH), 3.59 ppm (qd, 4H, $SO_2CH_2CH$), 3.08 ppm (m, 4H, $SO_2CH_2CH_2$), 1.99 ppm (s, 3H, $CCH_3$), 1.87 ppm (m, 4H, $SO_2CH_2CH_2$), 1.46 ppm (p, 4H, $SO_2CH_2CH_2CH_2$), 1.34 ppm (m, 4H, $CH_3CH_2CH_2$), 1.34 ppm (m, 4H, $CH_3CH_2CH_2$ and $CH_3CH_2$), and 0.92 ppm (t, 6H, $CH_2CH_3$).

Polymer Synthesis

The following monomers were used to prepare the polymers P1 to P6 and the comparative polymers CP1 to CP4.

MA1

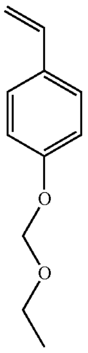

MA2

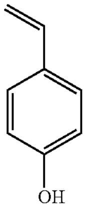

MB1

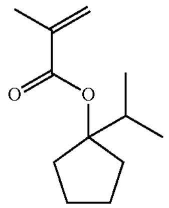

-continued

MB2

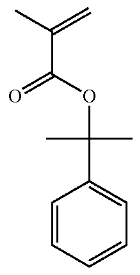

MS1

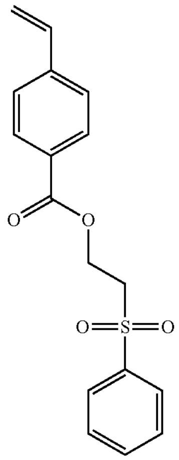

MS2

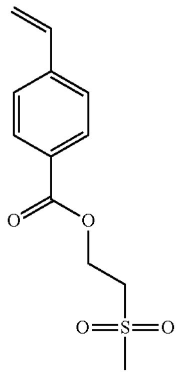

MS3

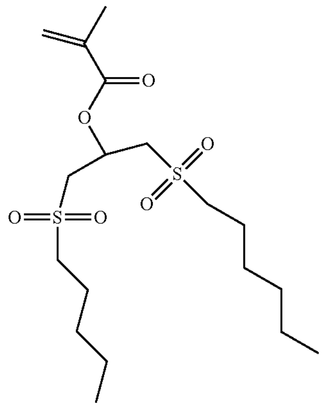

-continued

MS4

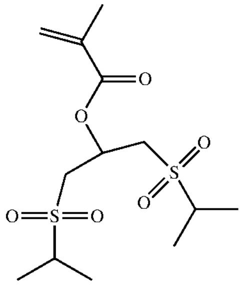

Synthesis of Polymer P1

Polymer P1 was prepared from the monomers MA1, MB2, and MS1 at a molar feed ratio of 45:45:10. A feed solution was prepared by dissolving MA1 (8.24 g, 42.8 mmol), MB2 (8.75 g, 42.8 mmol), and MS1 (3.01 g, 9.50 mmol) in propylene glycol monomethyl acetate (PGMEA, 20.0 g). An initiator solution was separately prepared by dissolving 2.32 g of the azo initiator dimethyl 2,2'-azobis (2-methylpropionate) (obtained as V-601 from Wako Pure Chemical Industries, Ltd.) in 6.43 g of a 1:1 (w/w/) mixture of PGMEA/tetrahydrofuran.

The polymerization was performed in a 3-neck round bottom flask fitted with a water condenser and a thermometer to monitor the reaction in the flask. The reactor was charged with 10.0 g of PGMEA and heated to 75° C. The feed solution and the initiator solution were each fed separately into the reactor using syringe pumps over 4 hours. Following the addition, the contents were then stirred for an additional 2 hours. The contents were subsequently cooled to room temperature, diluted with 20 g of PGMEA to produce a crude polymer solution. Subsequently, the acetal groups in the repeat unit derived from monomer MA1 were removed as follows. To the above crude polymer solution was added an acidic ion exchange resin and the mixture was stirred at room temperature for 24 hours. The ion exchange resin was removed by filtration and the solvent was removed under a reduced pressure. The resulting crude polymer was dissolved in acetone (25 g). The acetone polymer solution was added slowly to a large excess of DI water to precipitate the polymer. The resulting polymer precipitate was isolated by filtration and then washed with DI water. The polymer product was then dried at 35° C. under a reduced pressure.

Synthesis of Polymers P2 to P5 and Comparative Polymers CP1 to CP4

Each of the polymers in Table 1 was prepared using a similar procedure to that described for the preparation of Polymer P1, except that the monomers and molar feed ratios (mol %, based on 100 mol % total) as specified in Table 1 were used.

TABLE 1

| Polymer | Monomer 1 (mol %) | Monomer 2 (mol %) | Monomer 3 (mol %) |
|---|---|---|---|
| P1 | MA2 (45) | MB2 (45) | MS1 (10) |
| P2 | MA2 (45) | MB1 (45) | MS1 (10) |
| P3 | MA2 (45) | MB2 (45) | MS2 (10) |
| P4 | MA2 (45) | MB1 (45) | MS2 (10) |
| P5 | MA2 (45) | MB2 (45) | MS3 (10) |

TABLE 1-continued

| Polymer | Monomer 1 (mol %) | Monomer 2 (mol %) | Monomer 3 (mol %) |
|---|---|---|---|
| P6 | MA2 (45) | MB2 (45) | MS4(10) |
| CP1* | MA2 (45) | MB2 (55) | — |
| CP2* | MA2 (50) | MB1 (50) | — |
| CP3* | MA2 (45) | MB1 (55) | — |
| CP4* | MA2 (50) | MB2 (50) | — |

*denotes a comparative polymer

Lithographic Evaluation

Formulation Information

Photoresist compositions were prepared by dissolving solid components in solvents using the materials and amounts indicated in Tables 2 and 3, where the amounts are expressed in wt % based on 100 wt % of total weight of the solids. The total solids content for the photoresist compositions was 2.5 wt %. The solvent system contained PGMEA (50 wt %) and methyl-2-hydroxyisobutyrate (50 wt %). Each mixture was shaken using a mechanical shaker and then filtered through a PTFE disk-shaped filter having a pore size of 0.2 micron.

Lithographic Patterning and Data Analysis

Lithography was performed using a CLEAN IRAC ACT8 (TEL, Tokyo Electron Co.) wafer track. 200 nm wafers for photolithographic testing were coated with an AR™ 3 BAR$^c$ (DuPont Electronics & Industrial) and softbaked at 205° C. for 60 seconds to give a 60 nm film. A coating of AR™ 40A BAR$^c$ (DuPont Electronics & Industrial) was then disposed on the AR™ 3 layer and softbaked at 215° C. for 60 seconds to form a second BAR$^c$ layer having a thickness of about 80 nm. A photoresist composition was then coated onto the dual BAR$^c$ stack and soft-baked at 110° C. for 60 seconds to give a photoresist film layer having a thickness of about 70 nm.

The wafers were exposed with 248 nm radiation on a CANON FPA-5000 ES4 scanner (NA=0.8, outer sigma=0.85, inner sigma=0.57) with a mask having a 1:1 L/S pattern (120 nm linewidth). The wafers were post-exposure baked at 100° C. for 60 seconds, developed with MF™ CD26 TMAH developer (DuPont Electronics & Industrial) for 60 seconds, rinsed with DI water, and spin-dried. Critical dimension (CD) linewidth measurements of the formed patterns were made using a HITACHI S-9380 CD-SEM. Line width roughness (LWR) values were determined by top-down SEM at an accelerating voltage of 800 volts (V), probe current of 8.0 picoamperes (pA), using 200 K× magnification at 1.0 digital zoom, with the number of frames set to 64. The LWR was measured over a 2 μm line length in steps of 40 nm and reported as the average LWR for the measured region. Sizing energy ($E_{size}$) and line width roughness (LWR) of the lines were determined based on the CD measurements.

The pseudo Z-factor is reported below and was determined according to Equation 1:

$$\text{Psuedo } Z\text{-factor} = (E_{size}) \times (LWR)^2 \quad \text{(Equation 1)}$$

where $E_{size}$ is reported in millijoules per square centimeter (mJ/cm$^2$), LWR is reported in nanometers (nm), and the pseudo Z-factor is reported in mJ×10$^{-11}$. The pseudo Z-factor is a modified measure of photoresist performance based on the Z-factor, which is a known parameter indicative of RLS (Resolution, Line Edge Roughness, Sensitivity) photoresist performance (see, e.g., Wallow, T. et al Proc. SPIE 6921, 69211F, 2008). The pseudo Z-factor is calculated at a constant resolution (CD size).

Line Space (L/S) Patterning

The photoresist compositions of Table 2 were evaluated for L/S patterning under KrF exposure (248 nm) as described above and using a bright field mask pattern. $E_{size}$ and LWR of the spaces were determined based on the CD measurements. $E_{size}$ was determined as the irradiation energy dose at which the target 120 nm L/S pattern was resolved. The $E_{size}$, LWR, and pseudo-Z factor data are shown in Table 2. The amounts are specified in weight percent based on total solids.

TABLE 2

| Photoresist composition | Polymer | PAG | Additive | $E_{size}$ (mJ/cm$^2$) | LWR (nm) | Pseudo Z-factor (mJ E−11) |
|---|---|---|---|---|---|---|
| PR-1 | P3 (73.80) | PAG-B (18.45) | Q1 (7.75) | 122.65 | 5.24 | 3.37 |
| PR-2 | P4 (73.80) | PAG-B (18.45) | Q1 (7.75) | 125.24 | 5.07 | 3.21 |
| PR-3 | P3 (73.73) | PAG-A (15.42) | Q2 (10.85) | 109.60 | 5.47 | 3.27 |
| PR-4 | P4 (73.73) | PAG-A (15.42) | Q2 (10.85) | 110.26 | 4.94 | 2.69 |
| PR-5 | P1 (73.73) | PAG-A (15.42) | Q2 (10.85) | 104.76 | 5.42 | 3.08 |
| PR-6 | P2 (73.73) | PAG-A (15.42) | Q2 (10.85) | 104.28 | 5.31 | 2.95 |
| PR-7* | CP1 (73.73) | PAG-A (15.42) | Q2 (10.85) | 140.11 | 5.42 | 4.11 |
| PR-8* | CP2 (73.73) | PAG-A (15.42) | Q2 (10.85) | 145.47 | 5.56 | 4.49 |
| PR-9* | CP3 (73.73) | PAG-A (15.42) | Q2 (10.85) | 149.15 | 5.38 | 4.32 |

*denotes a comparative photoresist composition

The structures of PAG-A, PAG-B, Q1, and Q2 are shown below.

PAG-A

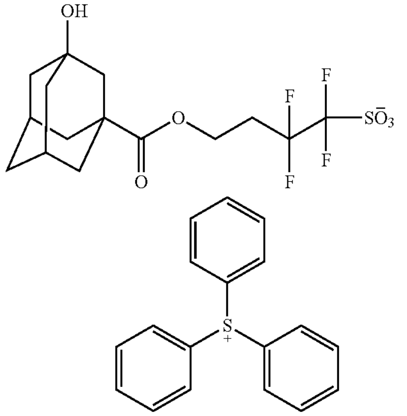

PAG-B

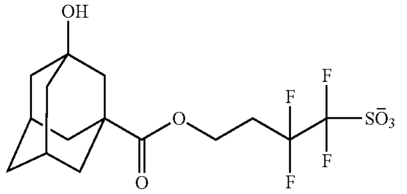

-continued

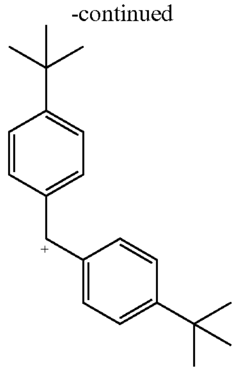

Q1

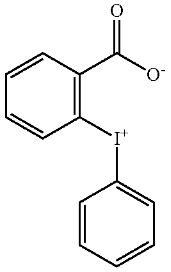

Q2

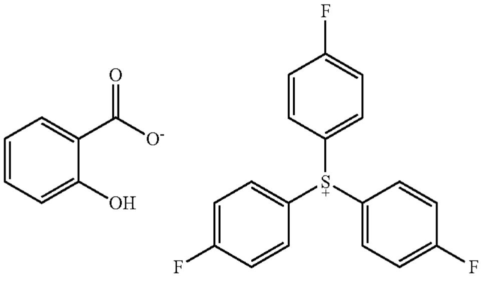

As can be seen in Table 2, the photoresist compositions PR-1 to PR-6 achieved improved sensitivity as evident by the smaller $E_{size}$ in comparison to comparative examples PR-7 to PR-8. The sensitivity improvement of photoresist compositions PR-1 to PR-6 didn't compromise the line/space features roughness as evident by the comparable or improved LWR compared to comparative compositions PR-7 to PR-9. In each case, the pseudo Z-factors of the photoresist compositions of PR-1 to PR-6 were less than the pseudo Z-factors of the comparative photoresist compositions PR-7 to PR-9.

Line Space (L/S) Patterning

The photoresist compositions of Table 3 were prepared in similar manner to previous examples and evaluated for line/space patterning under KrF exposure. 200 mm silicon wafers overcoated with a BAR[c] stack of 60 nm-thickness AR3 antireflectant over 80 nm-thickness AR40A antireflectant (DuPont Electronics & Industrial) were each spin-coated with a respective photoresist composition on a TEL Clean Track ACT 8 wafer track and softbaked at 110° C. for 60 seconds to provide a photoresist layer with a thickness of about 120 nm. The wafers were each exposed with 248 nm radiation on a CANNON FPA-5000 ES4 scanner (NA=0.8, outer sigma=0.85, inner sigma=0.57) using a mask having 120 nm line/space (1/s) patterns. The wafers were post-exposure baked at 100° C. for 60 seconds, developed with MF-CD26 TMAH developer (DuPont Electronics & Imaging) for 60 seconds, rinsed with DI water, and spin-dried. Critical dimension (CD) measurements of the formed 1/s patterns were made with a Hitachi S-9380 CD SEM. The line width roughness (LWR) of the targeted 120 nm space were determined based on the CD measurements. The results are shown in Table 3, where the amounts are specified in weight percent based on total solids.

TABLE 3

| Photoresist composition | Polymer | PAG | Additive | LWR (nm) |
|---|---|---|---|---|
| PR-10 | P5 (78.72) | PAG-B (19.68) | Q1 (1.60) | 4.44 |
| PR-11 | P6 (78.72) | PAG-B (19.68) | Q1 (1.60) | 5.52 |
| PR-12* | P10 (78.72) | PAG-B (19.68) | Q1 (1.60) | 7.43 |

*denotes a comparative photoresist composition

As can be seen in Table 3, the photoresist compositions PR-10 and PR-11 achieved improved LWR in comparison to comparative photoresist composition PR-12.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A polymer, comprising:

a first repeating unit comprising a sulfone group, wherein the sulfone group is directly bonded to a group of formula —C($R^a$)($R^b$)—; and a second repeating unit comprising an acid labile group chosen from tertiary alkyl ester groups, secondary or tertiary aryl ester groups, secondary or tertiary ester groups having a combination of alkyl and aryl groups, tertiary alkoxy groups, acetal groups, ketal groups, tertiary carbonate groups, and tertiary carbamate groups, a base-decomposable group, a hydroxy aryl, or a combination thereof, wherein $R^a$ and $R^b$ are each independently hydrogen, halogen, substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl, provided that at least one of $R^a$ and $R^b$ is hydrogen, wherein the first repeating unit is derived from a first monomer represented by Formula (1):

(1)

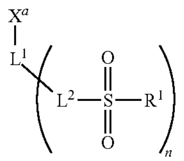

wherein, in Formula (1), $X^a$ is a polymerizable group comprising an ethylenically unsaturated carbon-carbon double bond;

$L^1$ is a single bond or a linking group;

each $L^2$ is independently a single bond, substituted or unsubstituted $C_{1-30}$ alkyl, or substituted or unsubstituted $C_{3-30}$ cycloalkyl; wherein at least one of $L^1$ or $L^2$ is not a single bond, each $R^1$ is independently substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl;

provided that at least one $L^2$ or at least one $R^1$ comprises the group of formula —C($R^a$)($R^b$)— that is directly bonded to —S(═O)$_2$—; and n is an integer from 1 to 5.

2. The polymer of claim 1, wherein the at least one $L^2$ comprises the group of formula —C($R^a$)($R^b$)— that is directly bonded to —S(═O)$_2$—.

3. The polymer of claim 1, wherein the at least one $R^1$ comprises the group of formula —C($R^a$)($R^b$)— that is directly bonded to —S(═O)$_2$—.

4. The polymer of claim 1, wherein the first repeating unit is derived from a first monomer represented by Formulae (2) or (3):

(2)

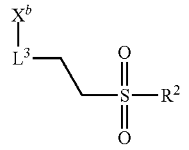

(3)

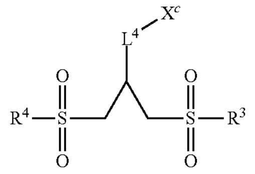

wherein, in Formulae (2) and (3), $X^b$ and $X^c$ are each independently a polymerizable group comprising an ethylenically unsaturated carbon-carbon double bond;

$L^3$ and $L^4$ are each independently a single bond or a divalent linking group;

$R^2$, $R^3$, and $R^4$ are each independently substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl.

5. The polymer of claim 1, wherein the first monomer comprises a (meth)acryloyl group or a vinyl aromatic group.

6. The polymer of claim 1, wherein the second repeating unit comprises the acid labile group.

7. A photoresist composition, comprising:

a first polymer, comprising:

a first repeating unit comprising a sulfone group, wherein the sulfone group is directly bonded to a group of formula —C($R^a$)($R^b$)—;

wherein $R^a$ and $R^b$ are each independently hydrogen, halogen, substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl;

provided that at least one of $R^a$ and $R^b$ is hydrogen; and a solvent, wherein the first repeating unit is derived from a first monomer represented by Formula (1):

(1)

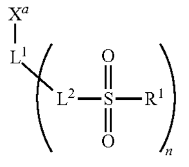

wherein, in Formula (1), $X^a$ is a polymerizable group comprising an ethylenically unsaturated carbon-carbon double bond;

$L^1$ is a single bond or a linking group;

each $L^2$ is independently a single bond, substituted or unsubstituted $C_{1-30}$ alkyl, or substituted or unsubstituted $C_{3-30}$ cycloalkyl; wherein at least one of $L^1$ or $L^2$ is not a single bond, each $R^1$ is independently substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl;

provided that at least one $L^2$ or at least one $R^1$ comprises the group of formula —C($R^a$)($R^b$)— that is directly bonded to —S(═O)$_2$—; and n is an integer from 1 to 5.

8. The photoresist composition of claim 7, wherein the polymer further comprises a second repeating unit, and wherein the second repeating unit comprises an acid labile group, a base-decomposable group, a polar group, or a combination thereof.

9. The photoresist composition of claim 8, wherein the second repeating unit comprises the acid labile group.

10. The photoresist composition of claim 7, further comprising a photoacid generator.

11. The photoresist composition of claim 7, further comprising a second polymer that is structurally different than the first polymer.

12. The photoresist composition of claim 11, wherein one or both of the first polymer and the second polymer comprise a repeating unit comprising an acid labile group, a base-decomposable group, a polar group, or a combination thereof.

13. A method of forming a pattern, the method comprising:

applying a layer of a photoresist composition of claim 7 on a substrate to form a photoresist composition layer;

pattern-wise exposing the photoresist composition layer with activating radiation to form an exposed photoresist composition layer; and developing the exposed photoresist composition layer.

14. The photoresist composition of claim 7, wherein the at least one $L^2$ comprises the group of formula —C($R^a$)($R^b$)— that is directly bonded to —S(═O)$_2$—.

15. The photoresist composition of claim 7, wherein the at least one $R^1$ comprises the group of formula —C($R^a$)($R^b$)— that is directly bonded to —S(═O)$_2$—.

16. The photoresist composition of claim 7, wherein the first repeating unit is derived from a first monomer represented by Formulae (2) or (3):

(2)

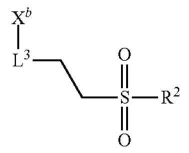

(3)

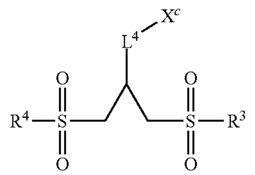

wherein, in Formulae (2) and (3), $X^b$ and $X^c$ are each independently a polymerizable group comprising an ethylenically unsaturated carbon-carbon double bond;

$L^3$ and $L^4$ are each independently a single bond or a divalent linking group;

$R^2$, $R^3$, and $R^4$ are each independently substituted or unsubstituted $C_{1-30}$ alkyl, substituted or unsubstituted $C_{3-30}$ cycloalkyl, substituted or unsubstituted $C_{3-30}$ heterocycloalkyl, substituted or unsubstituted $C_{2-30}$ alkenyl, substituted or unsubstituted $C_{3-30}$ cycloalkenyl, substituted or unsubstituted $C_{3-30}$ heterocycloalkenyl, substituted or unsubstituted $C_{6-30}$ aryl, substituted or unsubstituted $C_{7-30}$ arylalkyl, substituted or unsubstituted $C_{7-30}$ alkylaryl, substituted or unsubstituted $C_{2-30}$ heteroaryl, substituted or unsubstituted $C_{3-30}$ heteroarylalkyl, or substituted or unsubstituted $C_{3-30}$ alkylheteroaryl.

* * * * *